(12) United States Patent
Suehiro et al.

(10) Patent No.: US 7,938,561 B2
(45) Date of Patent: May 10, 2011

(54) LIGHT SOURCE UNIT

(75) Inventors: Yoshinobu Suehiro, Aichi-ken (JP); Koji Tasumi, Aichi-ken (JP); Kazue Tagata, Aichi-ken (JP)

(73) Assignee: Toyoda Gosei Co., Ltd., Nishikasugai-Gun, Aichi-Ken (JP)

( * ) Notice: Subject to any disclaimer, the term of this patent is extended or adjusted under 35 U.S.C. 154(b) by 290 days.

(21) Appl. No.: 12/232,760

(22) Filed: Sep. 23, 2008

(65) Prior Publication Data

US 2009/0086479 A1    Apr. 2, 2009

(30) Foreign Application Priority Data

Sep. 27, 2007  (JP) ................. 2007-250621

(51) Int. Cl.
*F21V 29/00*    (2006.01)
(52) U.S. Cl. .............. 362/249.02; 362/800; 362/218; 362/373
(58) Field of Classification Search .......... 362/612, 362/800, 555, 249.02, 311.02, 219, 218, 362/294, 373

See application file for complete search history.

(56) References Cited

U.S. PATENT DOCUMENTS

| | | | |
|---|---|---|---|
| 2006/0164836 A1 | 7/2006 | Suehiro et al. | |
| 2006/0215416 A1* | 9/2006 | Lucas et al. | 362/545 |
| 2006/0245201 A1 | 11/2006 | Wada et al. | |

FOREIGN PATENT DOCUMENTS

| | | |
|---|---|---|
| JP | 6-77112 (U) | 10/1994 |
| JP | 2002-093206 | 3/2002 |
| JP | 2004-327138 | 11/2004 |
| JP | 2006-310667 (A) | 11/2006 |
| JP | 2006-344450 | 12/2006 |

OTHER PUBLICATIONS

Japanese Office Action dated Feb. 22, 2011 with a partial English translation.

* cited by examiner

*Primary Examiner* — Laura Tso
(74) *Attorney, Agent, or Firm* — McGinn IP Law, PLLC

(57) ABSTRACT

A light source unit includes a light source portion including an LED element, a heat radiation portion that is connected to the light source portion, a case including an outside wall that is disposed apart from the light source portion and the heat radiation portion, and a spring member that is disposed between the outside wall of the case and the heat radiation portion.

10 Claims, 22 Drawing Sheets

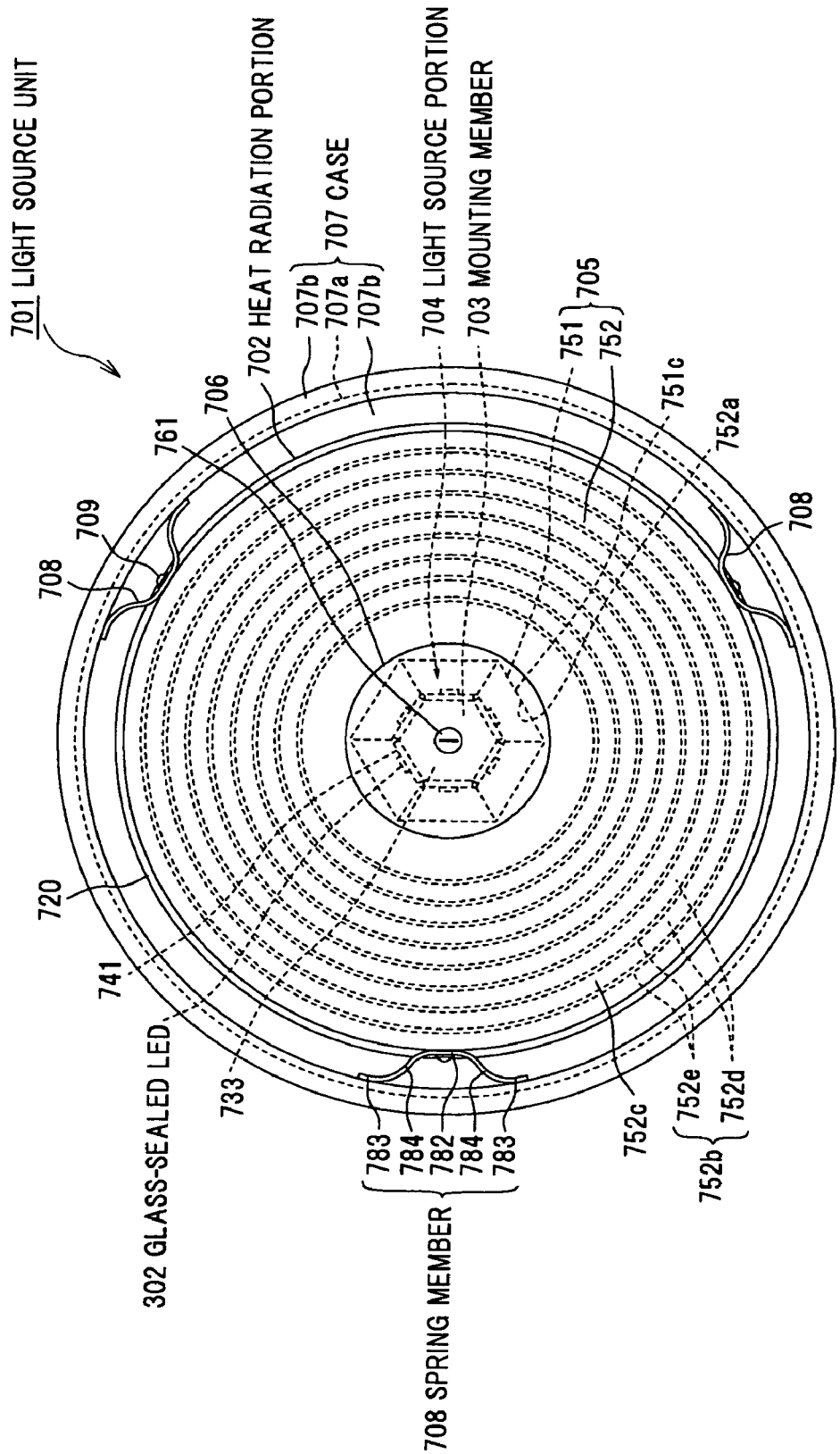

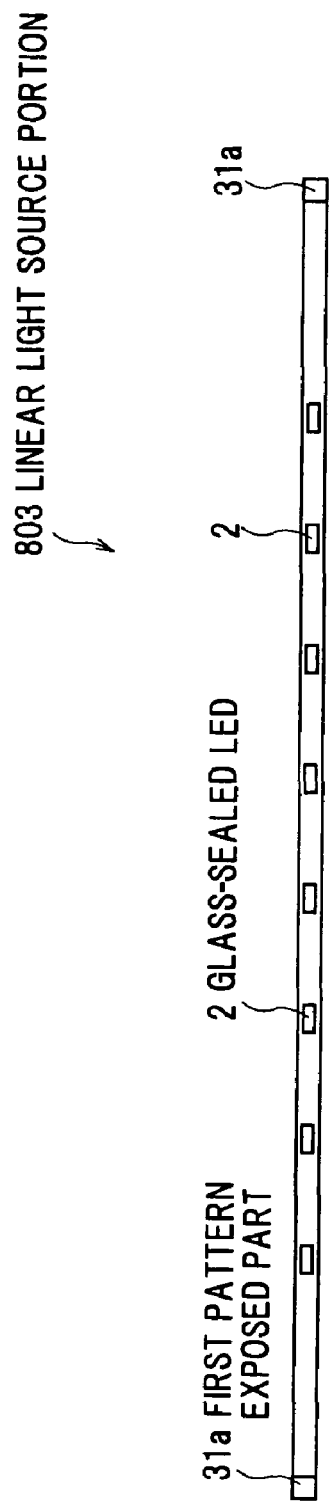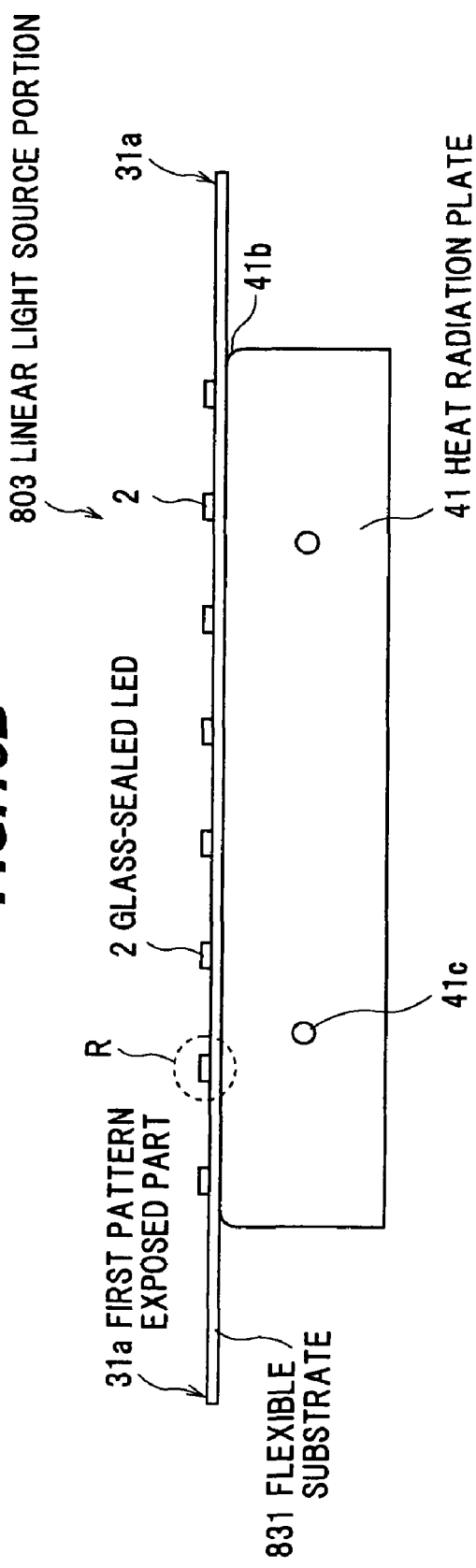

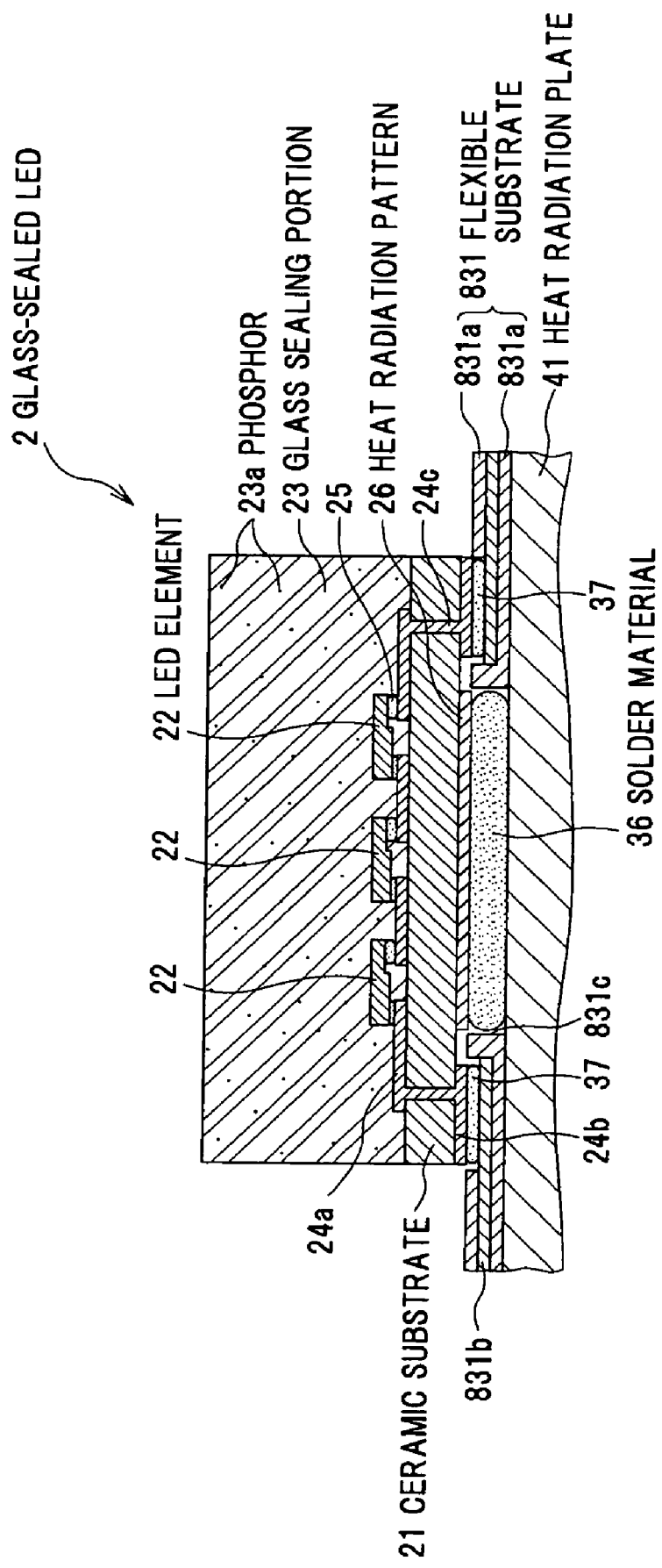

LIGHT SOURCE UNIT

The present application is based on Japanese patent application No. 2007-250621 filed on Sep. 27, 2007, the entire contents of which are incorporated herein by reference.

BACKGROUND OF THE INVENTION

1. Field of the Invention

This invention relates to a light source unit including a light source portion with an LED (light emitting diode) element, and a heat radiation portion connected to the light source portion.

2. Description of the Related Art

JP-A-2004-327138 discloses a light source unit using an LED. The light source unit is composed of a mounting board for mounting an LED chip thereon, and a case for housing the mounting board therein, the case including bottom portion and a cylindrical portion formed integrally. Plural LED chips are mounted on the mounting board, back of which being tightly contacted via a thermally conductive insulating material by an adaptor of aluminum etc.

The plural LED chips are connected in series parallel via a pattern formed on the mounting board and connected to electrodes at the center of the mounting board. The mounting board is supported by the case by plugging the electrodes into a socket of the case. JP-A-2004-327138 mentions the effect that most of heat generated from the LED chips can be transferred through the mounting board with the LED chips, thermally conductive insulating material and the adaptor to the case, and then radiated externally through the cylindrical portion of the case, However, the light source unit of JP-A-2004-327138 is constructed such that its components, i.e., the mounting board, the thermally conductive insulating material, the adaptor and the case are tightly contacted one another, and, therefore, it has the problem that relatively large stress is generated among the components when the components are thermally expanded by heating during operation. In addition, heat is positively transferred to the case being exposed outside and, therefore, external parts contacting the case may be heated and it is dangerous for a user to touch directly the case with his hand when handling the light source unit.

SUMMARY OF THE INVENTION

It is an object of the invention to provide a light source unit that can reduce the stress of the components during operation and suppress a rise in temperature of the case as much as possible.

(1) According to one embodiment of the invention, a light source unit comprises:

a light source portion comprising an LED element;

a heat radiation portion that is connected to the light source portion;

a case including an outside wall that is disposed apart from the light source portion and the heat radiation portion; and a spring member that is disposed between the outside wall of the case and the heat radiation portion.

In the above embodiment (1), the following modifications and changes can be made.

(i) The light source portion further comprises a glass sealing portion that is formed of glass and seals the LED element.

(ii) The light source portion further comprises a plurality of LED elements.

(iii) The case comprises a thermal conductivity lower than the heat radiation portion.

(iv) The spring member slidably contacts at least one of the case and the heat radiation portion.

(v) The spring member is plate-shaped.

(vi) The light source portion is elongated in a direction, the heat radiation portion comprises a rectangular plate, and one side of the rectangular plate is connected to the light source portion along the direction.

(vii) The case comprises a thermal conductivity lower than the heat radiation portion, and the spring member comprises a thermal conductivity between the case and the heat radiation portion.

(viii) The light source unit further comprises a reflection plate that surrounds the LED element for reflecting light emitted from the LED element, wherein the case comprises a thermal conductivity lower than the heat radiation portion, and the reflection plate comprises a thermal conductivity between the case and the heat radiation portion.

BRIEF DESCRIPTION OF THE DRAWINGS

The preferred embodiments according to the invention will be explained below referring to the drawings, wherein:

FIG. 18 is a top view showing the light source unit in FIG. 17;

FIG. 19A is a top view showing a linear light source portion in a fifth preferred embodiment according to the invention;

FIG. 19B is a side view showing the linear light source portion in FIG. 19A;

FIG. 20 is an enlarged cross sectional view showing a region R in FIG. 19A;

DETAILED DESCRIPTION OF THE PREFERRED EMBODIMENTS

First Embodiment

Figure 1:
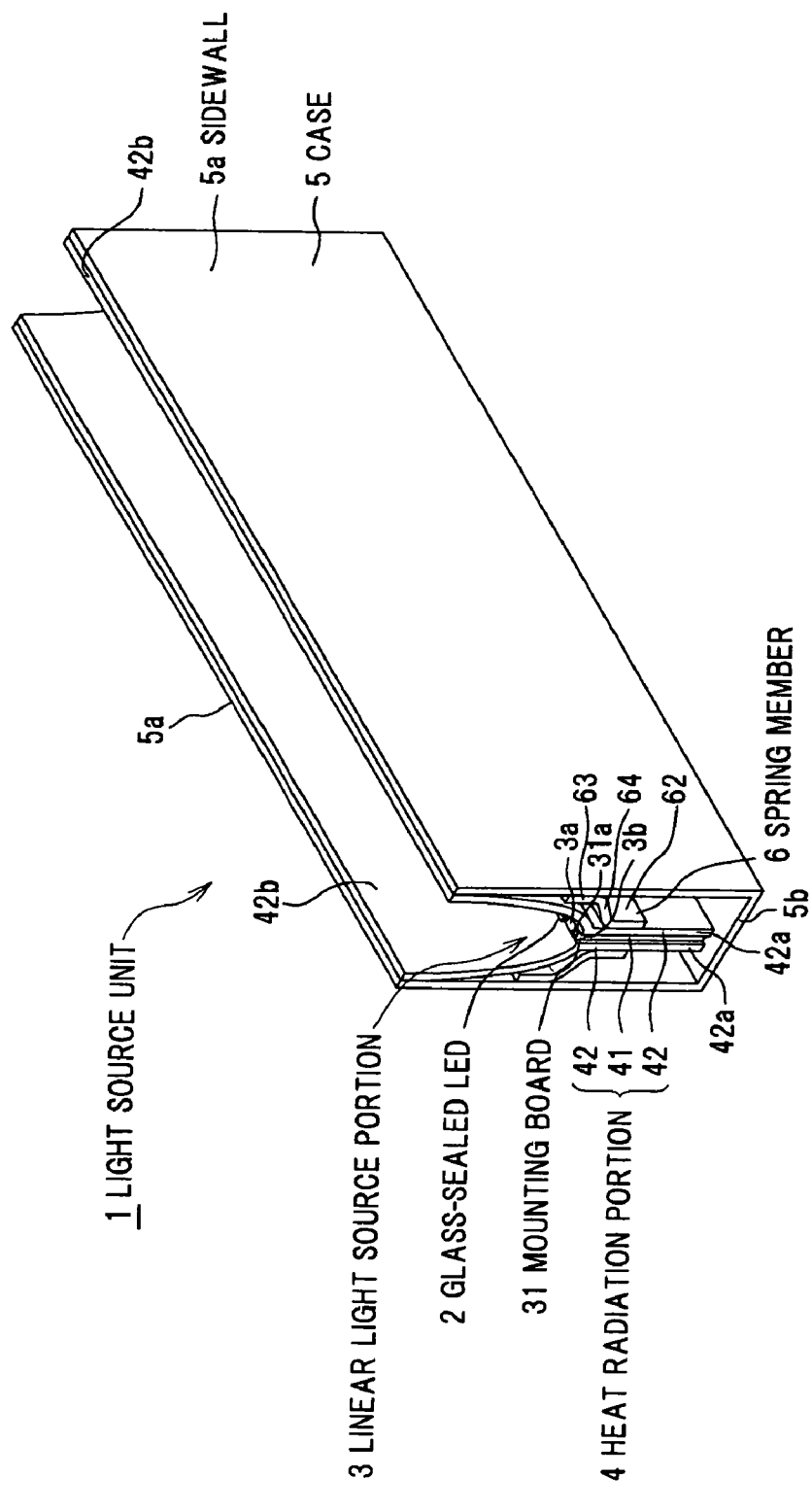
FIG. 1 is a perspective view showing a light source unit in a first preferred embodiment according to the invention.

FIGS. 1 to 6 show the first preferred embodiment of the invention and FIG. 1 is a perspective view showing a light source unit in the first embodiment.

As shown in FIG. 1, the light source unit 1 is composed of a linear light source portion 3 with plural glass-sealed LEDs 2 mounted on a top surface 3a thereof, a heat radiation portion 4 including a heat radiation plate 41 connected to a bottom surface 3b of the linear light source portion 3 and extending downward from the linear light source portion 3, and a case 5 housing the linear light source portion 3 and the heat radiation portion 4. The case 5 is composed of a pair of sidewalls 5a disposed a distance apart from the linear light source portion 3 as well as the heat radiation portion 4 and having a thermal conductivity lower than the heat radiation portion 4, and a bottom wall 5b connecting the lower ends of the sidewalls 5a and disposed a distance apart from the linear light source portion 3 and the heat radiation portion 4. The light source unit 1 is further composed of a pair of spring members 6 placed between the sidewall 5a of the case 5 and the heat radiation portion 4.

Figure 2:
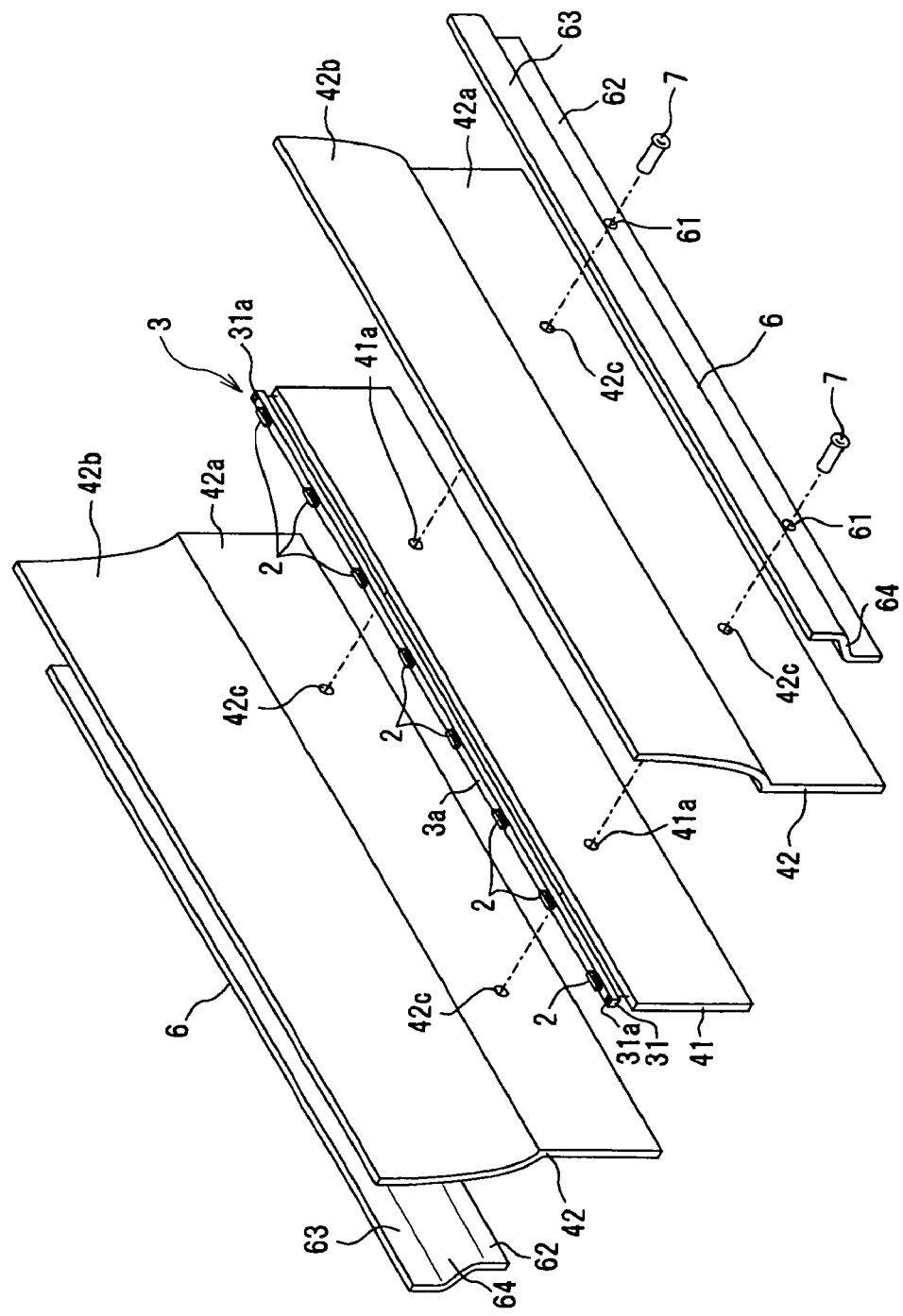
FIG. 2 is an exploded perspective view showing a part of the light source unit in FIG. 1.

FIG. 2 is an exploded perspective view showing a part of the light source unit in FIG. 1, where the case 5 is omitted for the sake of explanation.

As shown in FIG. 2, the heat radiation portion 4 is composed of the rectangular heat radiation plate 41 formed of metal and having both surfaces arranged in the vertical direction, and a pair of reflection plates 42 formed of metal. The reflection plates 42 are disposed outside the heat radiation plate 41 in the lateral direction, and the pair of the spring members 6 are disposed outside the reflection plates 42. The spring member 6 is plate-shaped and fixed being stacked on the heat radiation plate 41 and the reflection plate 42 by a rivet 7. The heat radiation plate 41 is provided with an insertion hole 41a for inserting the rivet 7 therethrough, the reflection plate 42 is provided with an insertion hole 42c for inserting the rivet 7 therethrough, and the spring member 6 is provided with an insertion hole 61 for inserting the rivet 7 therethrough. The linear light source portion 3 has the same width (a length in the lateral direction) as the heat radiation plate 41, and is secured to the upper end face (or one side) of the rectangular heat radiation plate 41 via a soldering material 38 (See FIG. 4).

Figure 3:
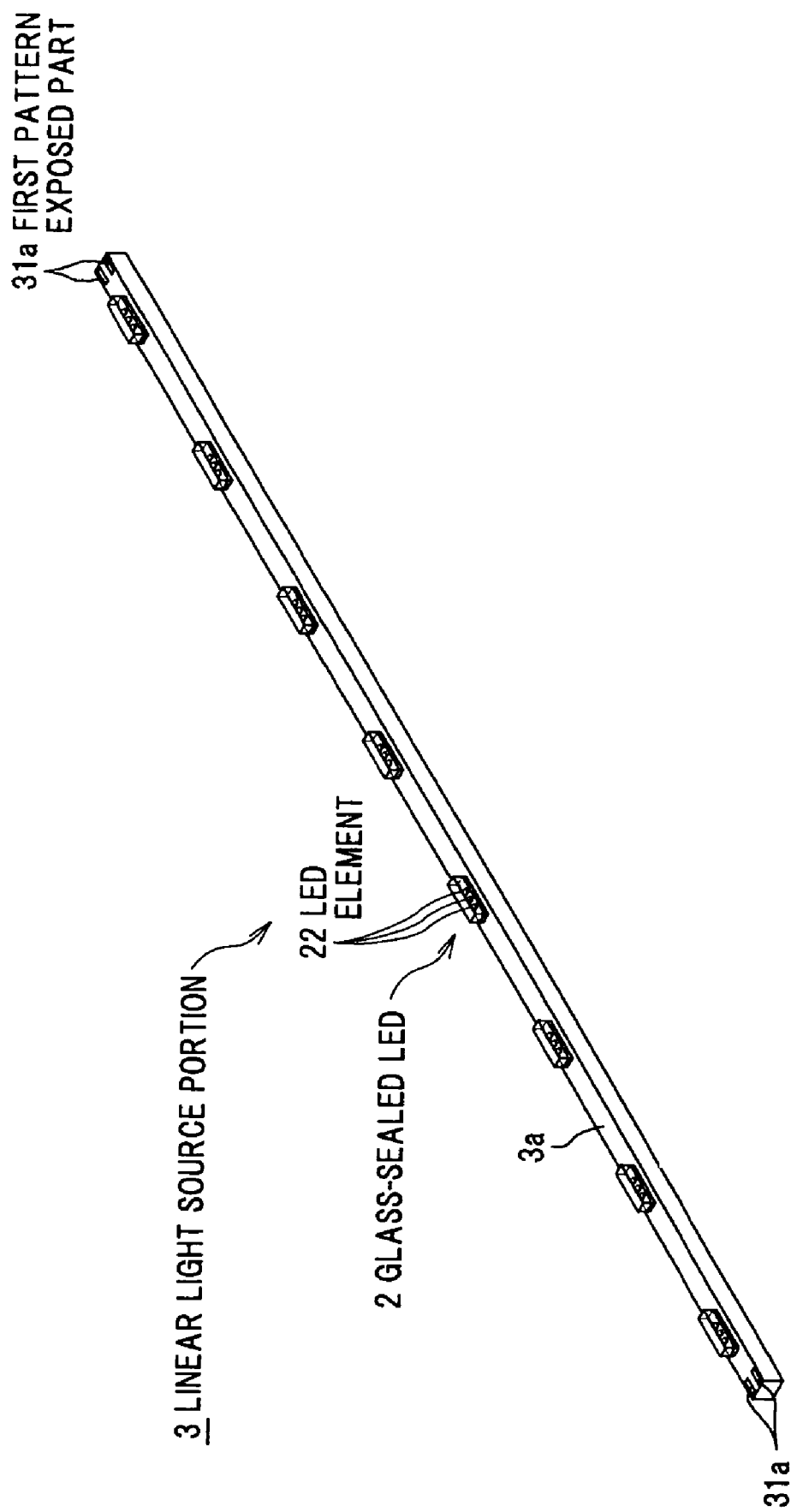
FIG. 3 is a perspective view showing a linear light source portion in FIG. 1.

FIG. 3 is a perspective view showing the linear light source portion in FIG. 1.

As shown in FIG. 3, the linear light source portion 3 is composed of a mounting board 31 elongated in the depth direction, and the plural glass-sealed LEDs 2 mounted in a row on the top surface 3a of the mounting board 31. In this embodiment, the eight glass-sealed LEDs 2 are mounted electrically connected in series. The glass-sealed LEDs 2 each include three LED elements 22 mounted on a ceramic substrate 21 and arranged in the depth direction, and the LED elements 22 are electrically connected in series. The LED elements 22 each emit light with a peak wavelength of 460 nm at forward voltage of 4.0 V and forward current of 100 mA. In the linear light source portion 3, since the twenty-four LED elements 22 are connected in series, about 4.0 V of forward voltage is applied to each of the LED elements 22 by using a domestic power supply of AC 100 V such that the LED elements 22 can be operated as expected.

Figure 4:
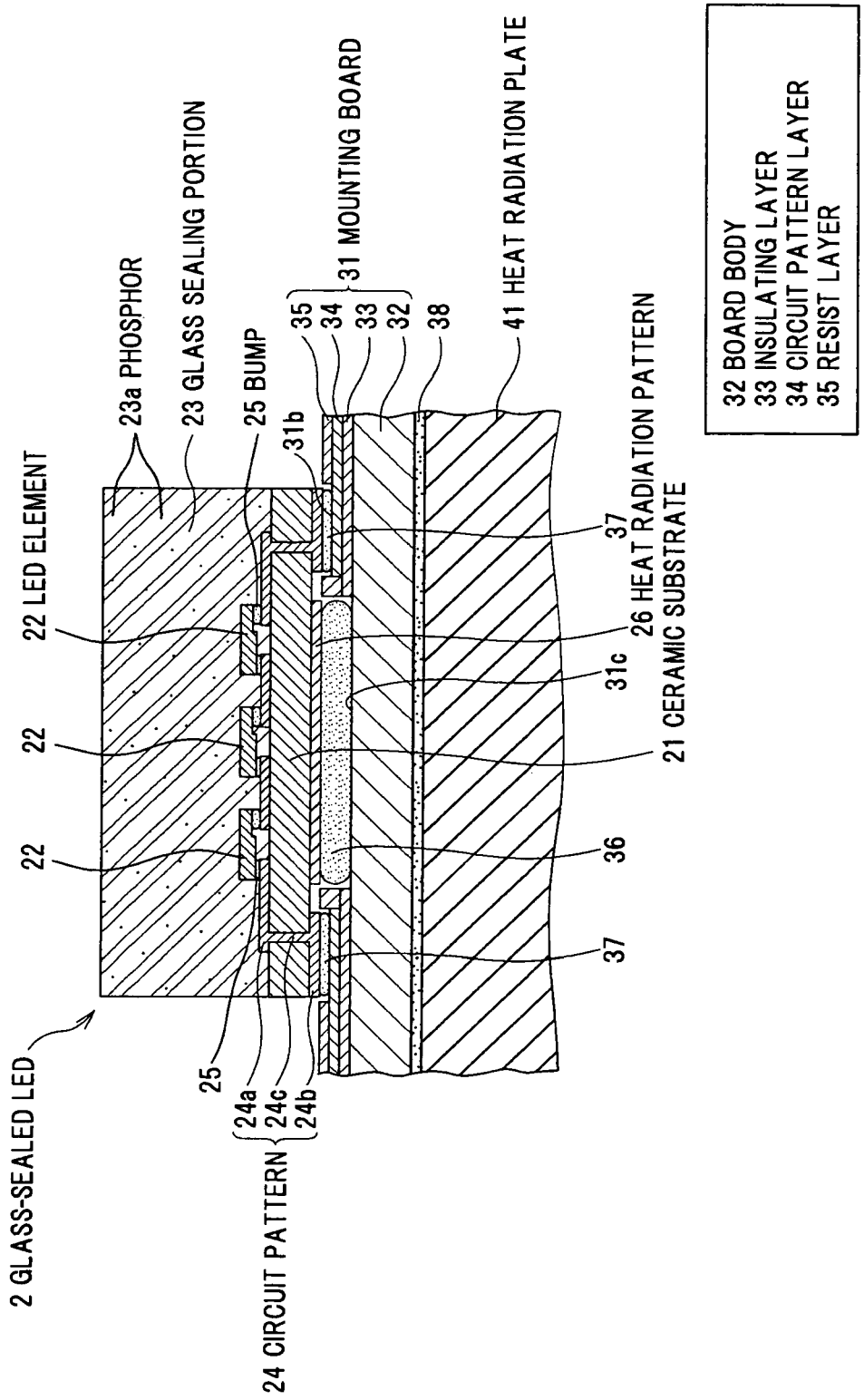
FIG. 4 is a cross sectional view showing the linear light source portion.

FIG. 4 is a cross sectional view showing the linear light source portion.

As shown in FIG. 4, the glass-sealed LED 2 is composed of the flip-chip type LED elements 22 formed of a GaN-based semiconductor material, the ceramic substrate 21 for mounting the LED elements 22 thereon, a circuit pattern 24 for supplying power to the LED elements 22 on the ceramic substrate 21, and a glass sealing portion 23 for sealing the LED elements 22 on the ceramic substrate 21.

The LED element 22 is composed of, on the surface of a growth substrate of GaN, a n-type layer, an MQW layer and a p-type layer formed of a group III nitride based semiconductor and epitaxially grown in this order. The LED element 22 is epitaxially grown at 700° C. or more, and has an upper temperature limit of 600° C. or more such that it is stable for process temperature during sealing by using low-melting point thermal fusion glass. The LED element 22 is provided with a p-side electrode formed on the p-type layer, a p-side pad electrode formed on the p-side electrode, and an n-electrode formed on a part of the n-type layer exposed by partially etching the p-type layer through the n-type layer. A bump 25 is formed on the p-side pad electrode and the n-side electrode. In this embodiment, the LED element 22 is 250 μm in thickness and 346 μm square in chip size. The growth substrate of the LED element 22 has a thickness half or more one side of the LED element 22.

The ceramic substrate 21 is formed of an alumina ($Al_2O_3$) polycrystalline sintered material, and it is 0.25 mm in thickness (i.e., a dimension in the vertical direction), 3.25 mm in length (i.e., a dimension in the longitudinal or lateral direction), and 0.9 mm in width (i.e., a dimension in the depth direction). As shown in FIG. 4, the circuit pattern 24 is composed of a upper pattern 24a formed on the top surface of the ceramic substrate 21 and electrically connected to the LED element 22, an electrode pattern 24b formed on the bottom surface of the ceramic substrate 21 and electrically connected to the mounting board 31, and a via pattern 24c electrically connecting the upper pattern 24a to the electrode pattern 24b. The electrode patterns 24b are formed at both ends of the ceramic substrate 21 in the longitudinal direction, and, of them, one is a positive electrode and the other is a negative electrode. A heat radiation pattern 26 is formed at the bottom of the ceramic substrate 21 and between the electrode patterns 24b.

The upper pattern 24a, the electrode pattern 24b and the heat radiation pattern 26 are each composed of a W (tungsten) layer formed on the surface of the ceramic substrate 21, a thin Ni plating layer covering the surface of the W layer, and a thin Ag plating layer covering the surface of the Ni plating layer. The via pattern 24c is formed of W and formed in a via hole penetrating through the ceramic substrate 21 in the thickness direction. In this embodiment, the electrode pattern 24b and the heat radiation pattern 26 are formed rectangular (in top view). The electrode pattern 24b is formed 0.4 mm in the longitudinal direction of the ceramic substrate 21, and 0.65 mm in the width direction of the ceramic substrate 21. The heat radiation pattern 26 is formed 1.8 mm in the longitudinal direction of the ceramic substrate 21, and 0.65 mm in the width direction of the ceramic substrate 21. The electrode pattern 24b and the heat radiation pattern 26 are 0.2 mm apart from each other in the longitudinal direction of the ceramic substrate 21. The heat radiation pattern 26 is formed directly under the LED elements 22 such that it overlaps (in top view) with the LED elements 22.

The glass sealing portion 23 is formed of $ZnO$—$Ba_2O_3$—$SiO_2$—$Nb_2O_5$—$Na_2O$—$Li_2O$ based thermal fusion glass. The thermal fusion glass is not limited to the above composition and may not include $Li_2O$ or may include as an optional element $ZrO_2$, $TiO_2$ etc. Alternatively, the glass sealing portion 23 may be formed of a sol-gel glass derived from a metal alkoxide. As shown in FIG. 4, the glass sealing portion 23 is formed a rectangular solid on the ceramic substrate 21, and has a height of 0.5 mm from the top surface of the ceramic substrate 21. The side face of the ceramic substrate 21 is formed such that a plate glass is bonded to the ceramic substrate 21 by hot pressing and is then cut together with the ceramic substrate 21 bonded thereto by using a dicer. The top surface of the glass sealing portion 23 forms a surface of the plate glass bonded to the ceramic substrate 21 by hot pressing. The thermal fusion glass is 490° C. in glass transition temperature (Tg), 520° C. in yielding point (At), $6 \times 10^{-6}$/° C. in thermal expansion coefficient ($\alpha$), and 1.7 in refractive index.

The glass sealing portion 23 contains phosphor 23a dispersed therein. The phosphor 23a is a yellow phosphor that emits yellow light with a peak wavelength in a yellow region by being excited by blue light emitted from the MQW layer. In this embodiment, the phosphor 23a is YAG (yttrium aluminum garnet). The phosphor 23a may be a silicate phosphor or a mixture of YAG and a silicate phosphor mixed at a predetermined ratio.

As shown in FIG. 4, the mounting board 31 is composed of a board body 32 of metal, an insulating layer 33 of a resin formed on the board body 32, a circuit pattern 34 of metal formed on the insulating layer 33, and a resist layer 35 of resin formed on the circuit pattern 34.

The board body 32 is formed of, e.g., copper (with a thermal conductivity of 380 W·m$^{-1}$·K$^{-1}$) and bonded via a soldering material 36 to the heat radiation pattern 26 of the glass-sealed LED 2. The insulating layer 33 is formed of, e.g., a polyimide resin or epoxy resin and serves to insulate the circuit pattern 34 from the electrically conductive board body 32. The circuit pattern 34 is formed of, e.g., copper with thin film gold formed on the top surface thereof, and electrically connected through the soldering material 37 to the electrode pattern 24b of the glass-sealed LED 2. The resist layer 35 is formed of, e.g., an epoxy based resin with a filler of titanium oxide, and white-colored. Thereby, the reflectivity of the upper surface of the linear light source portion 3 can be enhanced.

Figure 5:
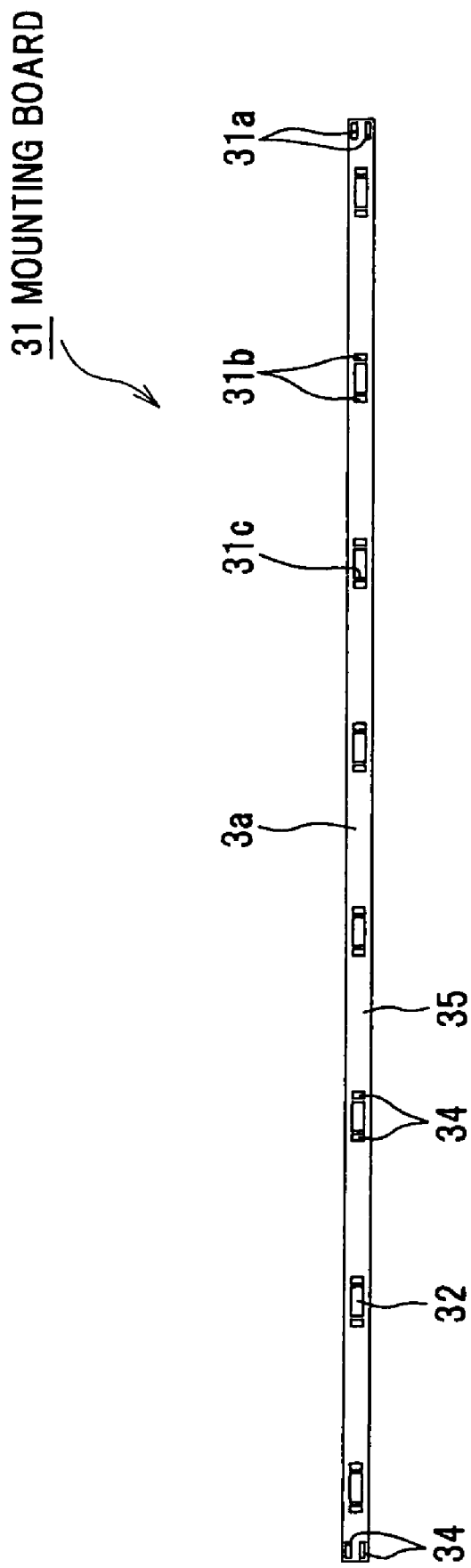
FIG. 5 is a top view showing a mounting board in FIG. 1.

FIG. 5 is a top view showing the mounting board in FIG. 1.

The mounting board 31 is formed 89.5 mm in length, 1.0 mm in width, and 1.0 mm in thickness. Namely, the mounting board 31 is slightly in width greater than the glass-sealed LED 2 mounted on the top surface 3a thereof. As shown in FIG. 5, the mounting board 31 is provided with a first pattern exposed portion 31a where the circuit pattern 34 is exposed at both ends thereof in the longitudinal direction. In this embodiment, a pair of the first pattern exposed portions 31a are formed, apart from each other in the width direction, at both ends of the mounting board 31 in the longitudinal direction. The first pattern exposed portions 31a are formed rectangular and extended in the longitudinal direction.

The mounting board 31 is further provided with a second pattern exposed portion 31b where the circuit pattern 34 is exposed and a heat radiation exposed portion 31c where the board body 32 is exposed, at a site for mounting the glass-sealed LED 2. The second pattern exposed portion 31b is formed corresponding to the electrode pattern 24b of the glass-sealed LED 2, and the heat radiation exposed portion 31c is formed corresponding to the heat radiation pattern 26 of the glass-sealed LED 2. The heat radiation exposed portion 31c is at the center of the mounting board 31 in the width direction and extended in the longitudinal direction, and the pair of the second pattern exposed portions 31b are disposed outside the heat radiation exposed portion 31c in the longitudinal direction. The heat radiation exposed portion 31c and the second pattern exposed portion 31b are formed with the same size (in top view) as the heat radiation pattern 26 and the electrode pattern 24b, respectively. In this embodiment, the distance between the centers of the adjacent heat radiation exposed portion 31c is 11.5 mm, and the distance between the center of the heat radiation exposed portions 31c at both ends of the mounting board 31 in the longitudinal direction and the end of the mounting board 31 in the longitudinal direction is 4.5 mm.

Figure 6:
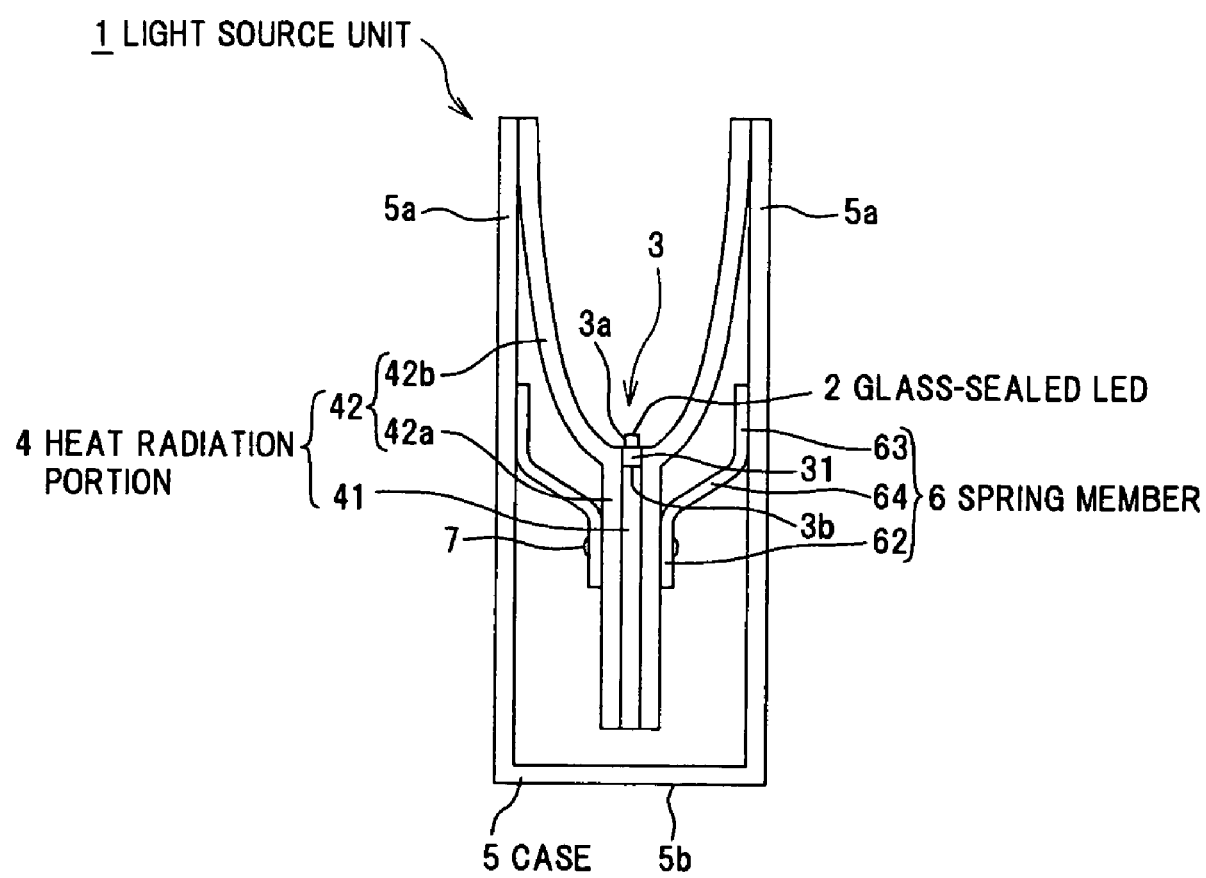
FIG. 6 is a front view showing the light source unit.

FIG. 6 is a front view showing the light source unit.

As shown in FIG. 6, the heat radiation plate 41 of the heat radiation portion 4 is in thickness (or in dimension in the lateral direction) the same as the mounting board 31 such that the mounting board 31 has common side face with the heat radiation plate 41. For example, the heat radiation plate 41 is 1.0 mm in thickness. The mounting board 31 and the heat radiation plate 41 are bonded to each other via the soldering material 38 (See FIG. 4). In this embodiment, the heat radiation plate 41 is formed of copper.

The reflection plate 42 is formed of aluminum (with a thermal conductivity of 200 W·m$^{-1}$·K$^{-1}$) and 0.5 mm in thickness. The reflection plate 42 is composed of a fixing portion 42a fixed to the side of the heat radiation plate 41, and a reflection mirror portion 42b formed continuously with the fixing portion 42a and extending in the direction apart from the linear light source portion 3 to reflect light radiated from the linear light source portion 3. In this embodiment, the reflection mirror portion 42b extends inclined outward in the lateral direction and obliquely upward from the upper end of the fixing portion 42a. The fixing portion 42a is plate-shaped, an upper end thereof is the same level as the top face of the mounting board 31, and a lower end thereof is the same level as the bottom of the heat radiation plate 41. The reflection plates 42 are secured to the heat radiation plate 41 together with the spring members 6 by the rivets 7 such that the inside face thereof is contacted with the mounting board 31 and the heat radiation plate 41.

The reflection plate 42 is provided with an inside surface that is formed parabolic (in front view) defining a focal point at the LED elements 22 of the glass-sealed LED 2. Thereby, of light radiated from the glass-sealed LED 2, light component inputted to the inside face of the reflection plate 42 is reflected upward. The upper end of the reflection mirror portion 42b is at the same level as the upper end of the sidewall 5a of the case 5. In this embodiment, the upper end of the outer face of the reflection mirror portion 42b is contacted with the upper end of the sidewall 5a of the case 5.

The spring member 6 of, e.g., copper is plate-shaped and extended in the depth direction. The material of the spring members 6 may vary depending on the intended use thereof. For example, the spring members 6 may be formed of a copper material to improve the heat radiation performance or of an iron or iron alloy material to improve the thermal insulation performance or elasticity.

The spring member 6 is composed of a fixing portion 62 fixed to the side face of the reflection plate 42, a contact portion 63 contacting the upper side of the sidewall 5a of the case 5, and a slope portion 64 extending inclined outward in the lateral direction and obliquely upward from the upper end of the fixing portion 62 and connecting the lower end of the contact portion 63. The contact portion 63 contacts the inside face of the sidewall 5a such that it slides on the inside face of the sidewall 5a when the spring member 6 is in elastic deformation. The spring members 6 are formed by bending a sheet of a plate member and energized in such a direction that the reflection plate 42 and the sidewall 5a are apart from each other.

The case 5 is formed of a material with a thermal conductivity smaller than the heat radiation portion 4. The case 5 is formed of, e.g., a stainless steel (with a thermal conductivity of 25 W·m$^{-1}$·K$^{-1}$), and it is composed of the sidewalls 5a as a pair of outside walls for covering the outside of the linear light source portion 3 and the heat radiation portion 4 in the width direction, and the bottom wall 5b as an outside wall for covering the bottom side of the linear light source portion 3 and the heat radiation portion 4 and connecting the lower end of the sidewalls 5a.

The light source unit 1 thus composed operates such that the LED elements 22 of the glass-sealed LED 2 emits blue light when a voltage is applied to the first pattern exposed portion 31a of the linear light source portion 3. Then, a part of blue light is converted into yellow light by the phosphor 23a, so that white light based on a combination of blue light and yellow light can be radiated from the glass-sealed LEDs 2. The glass-sealed LEDs 2 are arranged on the mounting board 31 in the longitudinal direction (i.e., in the depth direction in FIG. 6) and, therefore, the linear light source portion 3 can produce luminescence in linear form. In this embodiment, since the plural LED elements 22 are also arranged in the longitudinal direction inside the glass-sealed LED 2, the entire unit including the linear light source portion 3 etc. can be low-profile in the lateral direction (as shown in FIG. 6).

The LED elements 22 are flip-mounted with a GaN substrate having a thickness half or more the width of the LED element 22, and sealed with glass of high refractive index (n=1.7). Thereby, light emitted upward from the light emitting layer (MQW layer) of the LED element 22 can be inputted to the top surface or side surface of the element without returning to the light emitting layer again. There is no light barrier such as electrode or wire on the top surface or side surface of the element and, therefore, emitted light can be efficiently outputted into the glass from the interface between the GaN and the glass, where a critical angle of the glass to the GaN (n=2.4) is defined about 45 degrees. Thereby, heat generation caused by light absorption in the LED element 22 can be suppressed. GaN crystal grown on the GaN substrate is excellent in crystalline quality so that the LED element 22 can have high upper temperature limit. The GaN substrate has a electrical conductivity so that the current spreading property onto the light emitting layer can be enhanced and the luminescent efficiency can be maintained high even when current fed increases. Meanwhile, the other substrate such as an SiC substrate other than the GaN substrate can also have the same effects as the GaN substrate with respect to the light extraction efficiency from the LED element 22 and the current spreading property onto the light emitting layer. The glass may be further enhanced in refractive index by adding Bi etc. thereto.

Of white light outputted from the glass-sealed LED 2, light component inputted to the inside surface of the reflection plate 42 can be reflected upward by the inside surface. Thus, white light can be outputted from the light source unit 1 with a predetermined width in the lateral (or width) direction. Although a small amount of white light outputted from the glass-sealed LED 2 may be inputted to the mounting board 31, it can be reflected upward by the white resist layer 34 formed thereon so that optical loss occurs little. In the light source unit 1 of this embodiment, light flux per length in the linear light source portion 3 is about 31 m/mm or more, which is higher than that in fluorescent lamps. Thus, the light source unit 1 can be in width about one thirtieth (1/30) of the fluorescent lamps.

If the LED is sealed with resin as in the conventional LED, deterioration such as yellowing of the resin by heat as well as light occurs such that it causes a reduction in light intensity or a color change with time. In addition, due to the large thermal expansion coefficient ($\alpha$) (e.g., 150 to 200×10$^{-6}$/° C. in silicone) of the resin sealant, expansion or contraction by a change in temperature may cause disconnection at an electrical connection site of the LED element.

In contrast, the glass sealing material in this embodiment does not cause deterioration by light and heat, and the thermal expansion coefficient thereof is relatively close to that of the LED element 22 such that electrical disconnection does not occur. The glass is not limited to the low-melting point glass and may be a sol-gel glass derived from a metal alkoxide.

On the other hand, a metalworking fluid is used for working the metal member such as the heat radiation plate 41 and the reflection plate 42 of the heat radiation portion 4, so that an organic substance included in the metalworking fluid may be slightly left on the heat radiation portion 4. In this case, although the organic substance is evaporated by heat during the operation of the light source unit 1, the organic substance does not penetrate through the sealing material to deteriorate it since the sealing material of the glass-sealed LED 2 is formed of glass. The ceramic substrate 21 is bonded to the glass sealing portion 23 via chemical bond of oxide and, therefore, the organic substance evaporated does not penetrate through the interface between them such that separation can be prevented at the interface between them. Thus, the light source unit 1 of this embodiment can keep the initial characteristics for a long term.

In case of the conventional resin-sealed LED, the organic substance evaporated does penetrate through the resin sealing material to accelerate the deterioration of the sealing material.

Thus, the light source unit 1 of this embodiment can solve the problem of the conventional light source unit composed of a resin-sealed LED and a metal heat radiation portion.

Heat generated at the LED elements 22 of the glass-sealed LED 2 is transferred through the heat radiation pattern 26 to the board body 32. Here, the LED elements 22 of the glass-sealed LED 2 are placed directly on the region where the heat radiation pattern 26 is formed, and they are bonded to the board body 32 at the region without any insulating layer having a large thermal resistance therebetween. Therefore, heat generated at the LED elements 22 can be surely transferred from the heat radiation pattern 26 to the board body 32. Then, heat transferred to the board body 32 is further transferred to the heat radiation plate 41 of the heat radiation portion 4. The board body 32 and the heat radiation plate 41 are both formed of copper relatively high in thermal conductivity and bonded to each other via a metal material such that heat can be smoothly transferred between them. Heat transferred to the heat radiation plate 41 is further transferred to the reflection plates 42 and the spring members 6 such that it can be radiated in the air from the surface of the reflection plates 42 and the spring members 6.

In this embodiment, the fixing portion 62 and the contact portion of the spring member 6 are bent with respect to the slope portion 64 such that they are formed along the heat radiation plate 41 and the case 5, respectively. Thereby, the contact area between the heat radiation plate 41 or the case 5 and the spring member 6 can be increased. Thus, thermal conduction from the heat radiation plate 41 to the spring member 6 can be enhanced, and the heat radiation portion 4 enclosed in the case 5 can be stably held.

The thermal resistance between the LED element 22 and the reflection plate 42 is small and the temperature difference therebetween is small, so that the reflection plate 42 is at high temperature. The reflection plates 42 is provided with the reflection mirror portion 42b for optical control in addition to the fixing portion 42a contacted with the heat radiation plate 41. Thereby, the contact area between the heat radiation portion 4 and the air can be increased to enhance the heat radiation effect.

Here, the surfaces of the heat radiation plate 41 are arranged perpendicular to the width (or lateral) direction of the linear light source portion 3 such that the space for heat radiation can be assured in the case 5 without increasing the dimension of the light source unit 1 in the width direction. Thus, the entire unit can be low-profile in the width direction while assuring the desired heat radiation property.

In the light source unit 1 of this embodiment, the heat radiation property of the linear light source portion 3 can be significantly enhanced without exposing the heat radiation portion 4 such that heat generated from the LED elements 22 arranged in a row can be surely radiated. Therefore, even when the construction is changed to increase the amount of heat generation such that the light intensity of the LED elements 22 increases or the LED elements 22 are arranged densely, the performance of the LED elements 22 can be sufficiently brought out.

If the heat radiation plate 41 is not used, the temperature of the LED elements 22 may rise such that the reliability is affected thereby. The temperature that may affect the reliability is, e.g., more than 150° C. or more than 200° C. although it depends on the LED element 22. Even if trying to get the heat radiation property by only the mounting board 31, the heat radiation area must be reduced since the thickness of the mounting board 31 is limited (e.g., to about twice the width) by the requirements for production. Therefore, current fed to the LED elements 22 is limited such that it is impossible to have a large light intensity.

In this embodiment, by using the heat radiation plate 41, it is possible to have a large light intensity without affecting the reliability of the LED elements 22. The heat radiation plate 41 is at high temperature in the range of not affecting the reliability of the LED elements 22, and the heat radiation property can be obtained by the difference from the atmosphere temperature.

The sidewalls 5a of the case 5 are disposed apart from the linear light source portion 3 such that heat is not directly transferred from the linear light source portion 3. Therefore, the temperature rise of the case 5 can be suppressed such that it is safe to hold the case 5 directly with hand.

The spring members 6 are disposed in close contact with the sidewall 5a of the case 5 while being fixed to the heat radiation portion 4, so that the heat radiation portion 4 can be positioned to the sidewalls 5a in the lateral direction. The spring members 6 are in elastic deformation such that they can absorb an error in dimension of parts and an error in installation of the parts, and the production yield of the unit can be improved thereby.

When the parts of the heat radiation portion 4 are thermally expanded by heat generated from the glass-sealed LED 2, stress generated inside the parts can be relaxed by the elastic deformation of the spring members 6. Especially when excessive load is applied to the spring members 6, since the spring members 6 are not restricted by the case 5, the contact portion 63 of the spring members 6 can slide on the sidewall 5a such that excessive stress is not generated in the heat radiation portion 4, the case 5 etc. as well as the spring members 6.

Thus, stress to the parts generated when feeding current to the glass-sealed LED 2 can be reduced to prevent the deformation of the parts. Also, the difference in repeated stress between turning on and turning off electricity can be reduced to enhance the reliability of the parts. Corresponding to the contact portion 63 of the spring member 6, the case 5 may be provided with an uneven (or engaging) part for positioning the spring member 6.

Although the contact area between the case 5 and the reflection plates 42 or the spring members 6 is small, heat may be a little conducted from them to the case S. However, since the reflection mirror portion 42b of the heat radiation portion 4 and the contact portion 63 of the spring member 6 contact the upper side of the sidewall 5, heat transferred to the case 5 concentrates on the upper side. Therefore, since the temperature rise can be relatively suppressed on the side of the bottom wall 5b, the safety can be further enhanced in the usage that an external device contacts only the side of the bottom wall 5b or the user holds only the side of the bottom wall 5b.

By using the rivet 7, the heat radiation portion 4 and the spring members 6 can be easy assembled regardless of the kind of their materials. Alternatively, if the spring members 6 and the heat radiation portion 4 are both formed of materials suitable for soldering, they may be bonded by soldering. Further, instead of the rivet 7, the spring members 6 and the heat radiation portion 4 may be bonded by a bolt and a nut.

Modification 1

Figure 7:
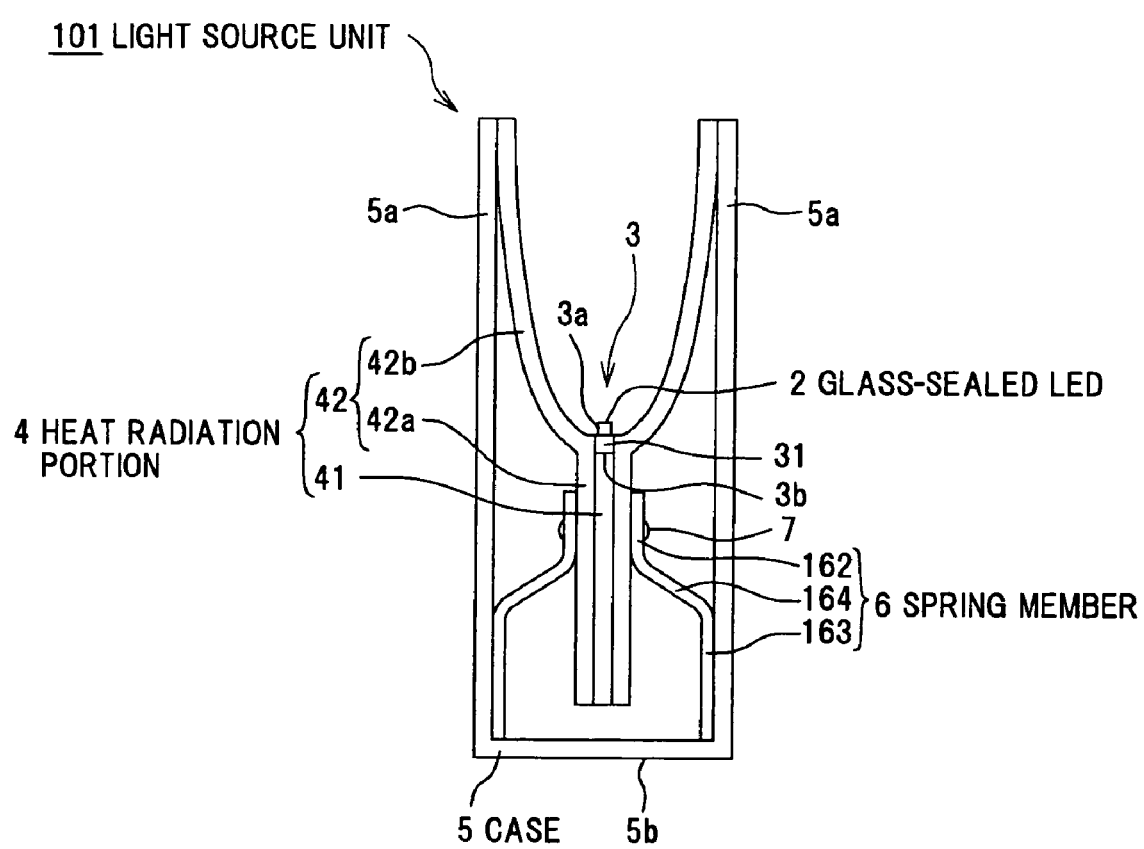
FIG. 7 is a front view showing a modification of the first embodiment.

Although in the first embodiment the spring members 6 contact the upper side of the sidewalls 5a of the case 5, alternatively, as shown in FIG. 7, the spring members 6 may contact the lower side of the sidewall 5a of the case 5.

As shown in FIG. 7, a light source unit 101 is provided with spring members 106 that are plate-shaped and formed of, e.g., copper. The spring members 106 are composed of a fixing portion 162 fixed to the side face of the reflection plates 42, a contact portion 163 contacting the lower side of the sidewall 5a of the case S, and a slope portion 164 extending inclined outward in the lateral direction and obliquely downward from the lower end of the fixing portion 162 and connecting the upper end of the contact portion 163. The lower end of the contact portion 163 contacts the bottom wall 5b.

The light source unit 101 is constructed such that the reflection mirror portion 42b of the reflection plates 42 of the heat radiation portion 4 extends upward and the slope portion 164 of the spring members 106 extends downward. Thus, heat conducted from the heat radiation portion 4 to the case 5 can be uniformly dispersed in the vertical direction of the case 5. In addition, by the spring members 106 contacting the bottom wall 5b, the linear light source portion 3 and the heat radiation portion 4 can be positioned to the case 5 in the vertical direction.

Modification 2

Figure 8:
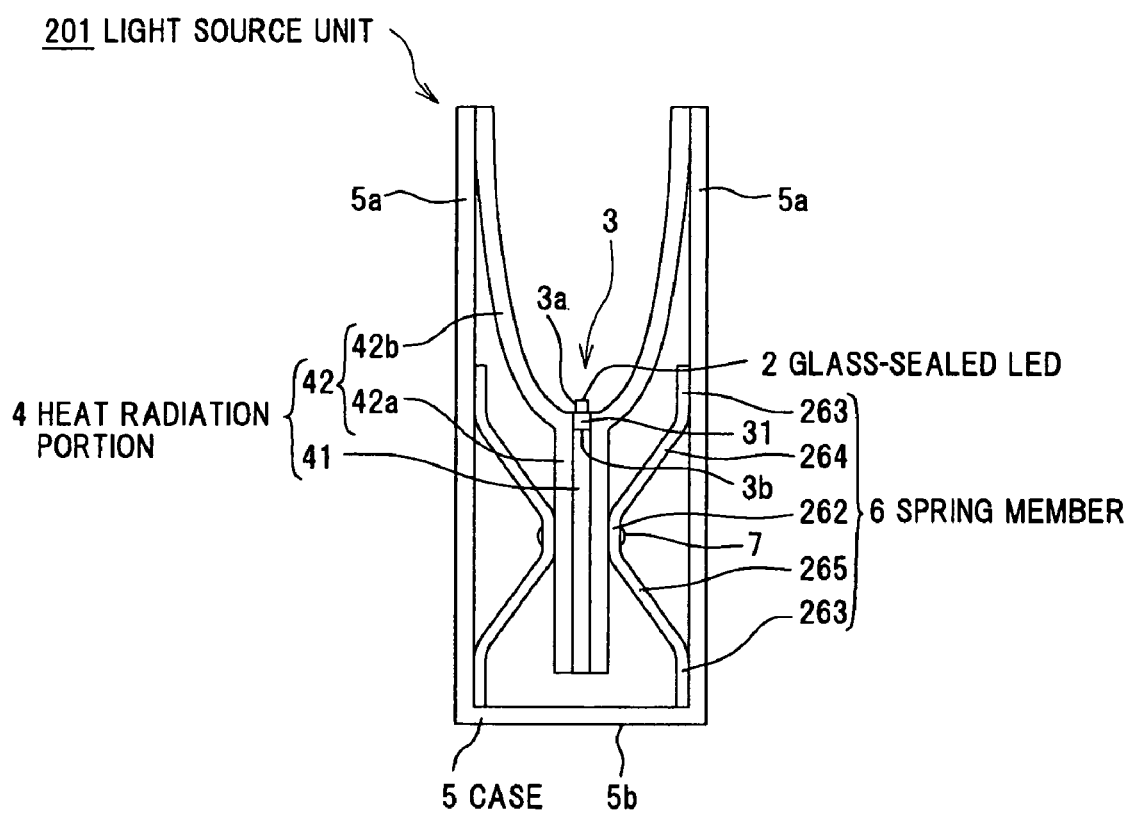
FIG. 8 is a front view showing another modification of the first embodiment.

Alternatively, as shown in FIG. 8, spring members 206 may be composed of a fixing portion 262 fixed to the side face of the reflection plates 42, a pair of contact portions 263 contacting the upper and lower sides of the sidewall 5a of the case 5, a first slope portion 264 extending obliquely toward the upper contact portion 263 from the fixing portion 262, and a second slope portion 265 extending obliquely toward the lower contact portion 263 from the fixing portion 262. The spring member 206 is formed of an iron alloy (with a thermal conductivity of 50 W·m$^{-1}$·K$^{-1}$), formed symmetrically in the vertical direction. The lower end of the lower contact portion 263 contacts the bottom wall 5b.

The light source unit 201 is provide with the spring member 206 formed symmetrically in the vertical direction, so that the spring force applied to the heat radiation portion 4 and the case 5 is not biased in the vertical direction. Internal stress generated in the spring members 206 can be reduced.

Modification 3

Figure 9:
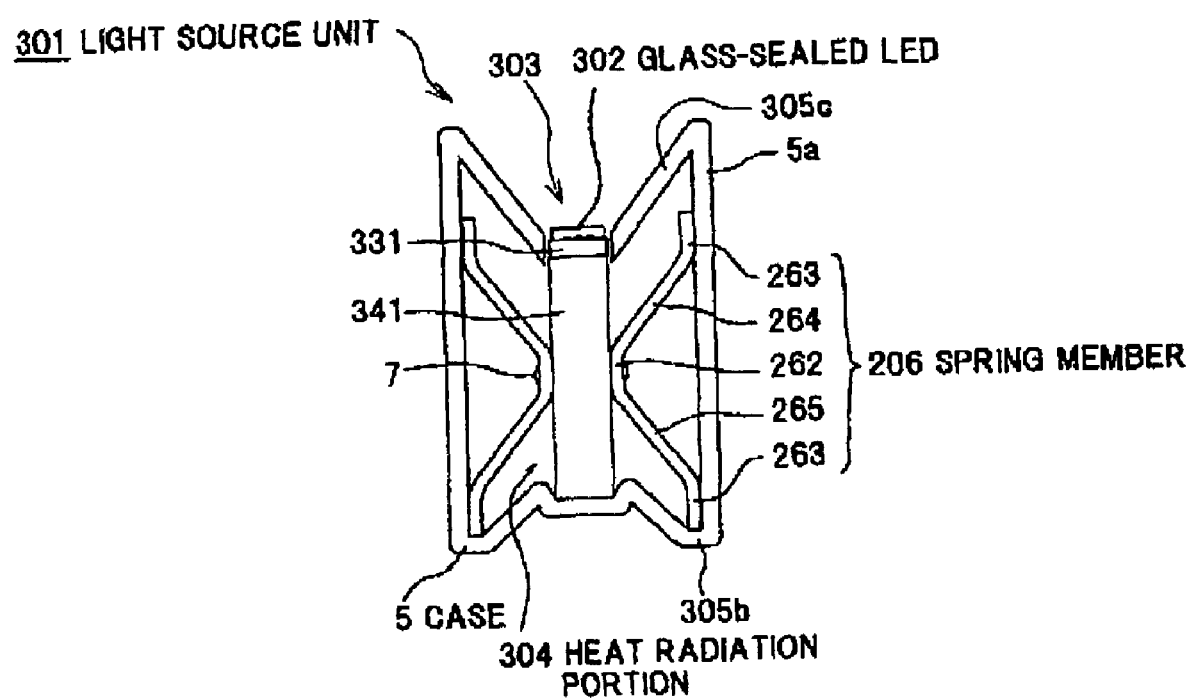
FIG. 9 is a front view showing another modification of the first embodiment.

Although in the first embodiment the heat radiation portion 4 is provided with the reflection plate 42, alternatively, as shown in FIG. 9, a reflection mirror portion 305c may be formed by bending the upper side of a case 305 to the side of a linear light source portion 303.

As shown in FIG. 9, a light source unit 301 is provided with the linear light source portion 303 that three glass-sealed LEDs 302 are at equal intervals mounted on a mounting board 331, and one of the glass-sealed LEDs 302 includes nine LED elements 22 arranged in three rows in the lateral and depth directions, respectively. A heat radiation portion 304 includes a heat radiation plate 341 and a pair of spring members 206 on both sides in the lateral direction are fixed to the heat radiation plate 341 by the rivet 7. A bottom wall 305b of the case 305 is provided with a convex part projecting toward the heat radiation portion 304 and contacting the lower end of the heat radiation plate 341.

Modification 4

Although in the first embodiment the spring members 6 are provided with the slope portion 64 formed linear (in front view) for connecting the fixing portion 62 with the contact portion 63, the spring members 6 may be arbitrarily formed.

Figure 10:
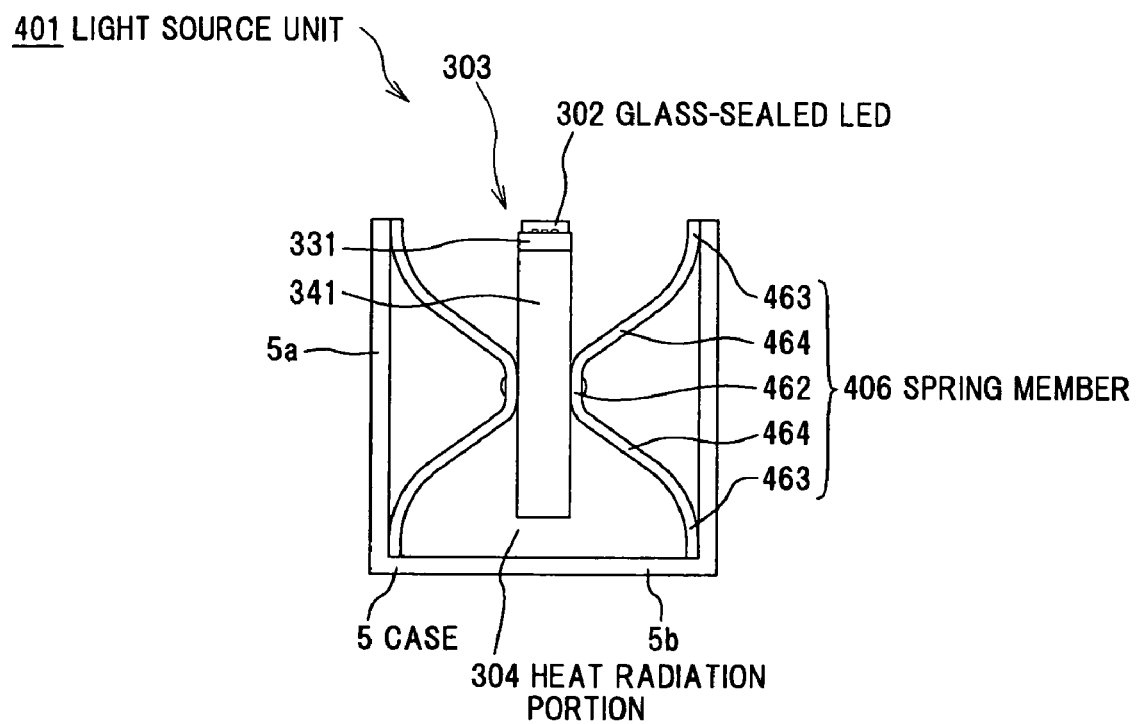
FIG. 10 is a front view showing another modification of the first embodiment.

As shown in FIG. 10, spring members 406 may be provided with curved portions 464 between a fixing portion 462 and a contact portion 463. As shown in FIG. 10, a light source unit 401 is not provided with a reflection mirror or a lens for controlling light radiated from the linear light source portion 303, and light emitted from the glass-sealed LEDs 302 is externally radiated directly.

Other Modifications

Although in the first embodiment the heat radiation plate 41 is formed of copper, it may be formed of another metal such as aluminum, brass etc. The heat radiation plate 41 may be formed in arbitrary shape other than rectangular as mentioned above. The heat radiation portion 4 may be constructed arbitrarily. For example, it may be provided with a fin etc. connected to the heat radiation plate 41. In brief, the heat radiation plate 41 only has to be structured such that the linear light source portion 3 is mounted on the end face thereof.

Although in the first embodiment the mounting board 31 is provided with the board body 32 as a copper base board, it may be provided with another metal base board such as a aluminum base board. Further, the mounting board 31 may be a flexible substrate of polyimide or liquid-crystal polymer, and it may be disposed between the glass-sealed LED 2 and the heat radiation plate 41. In case of using a relatively thin film substrate as the mounting board 31, from the viewpoint of heat radiation property, it is desirable that the substrate is provided with a hole corresponding to the heat radiation pattern 26 of the glass-sealed LED 2 and the heat radiation pattern 26 is directly bonded via solder etc. to the heat radiation plate 41. Here, in case of the insulating layer of the meal base substrate formed of copper or aluminum and the relatively thin film insulating portion formed of polyimide or liquid-crystal polymer, shape restrictions on forming the hole are few as compared to the case of a relatively thick insulating portion of a glass epoxy substrate etc. Thus, as in the above embodiment, the hole can be easy formed even corresponding to the heat radiation pattern of the relatively small glass-sealed LED 2, or the mounting board with a relatively small width.

Although in the first embodiment the glass-sealed LEDs 2 are electrically in series connected, they may be electrically in parallel connected. Further, although the glass-sealed LED 2 is bonded to the heat radiation plate 41 without any insulating layer therebetween, it may be bonded thereto via an insulating layer or flexible substrate, where restrictions such as current fed increase.

Second Embodiment

Figure 11:
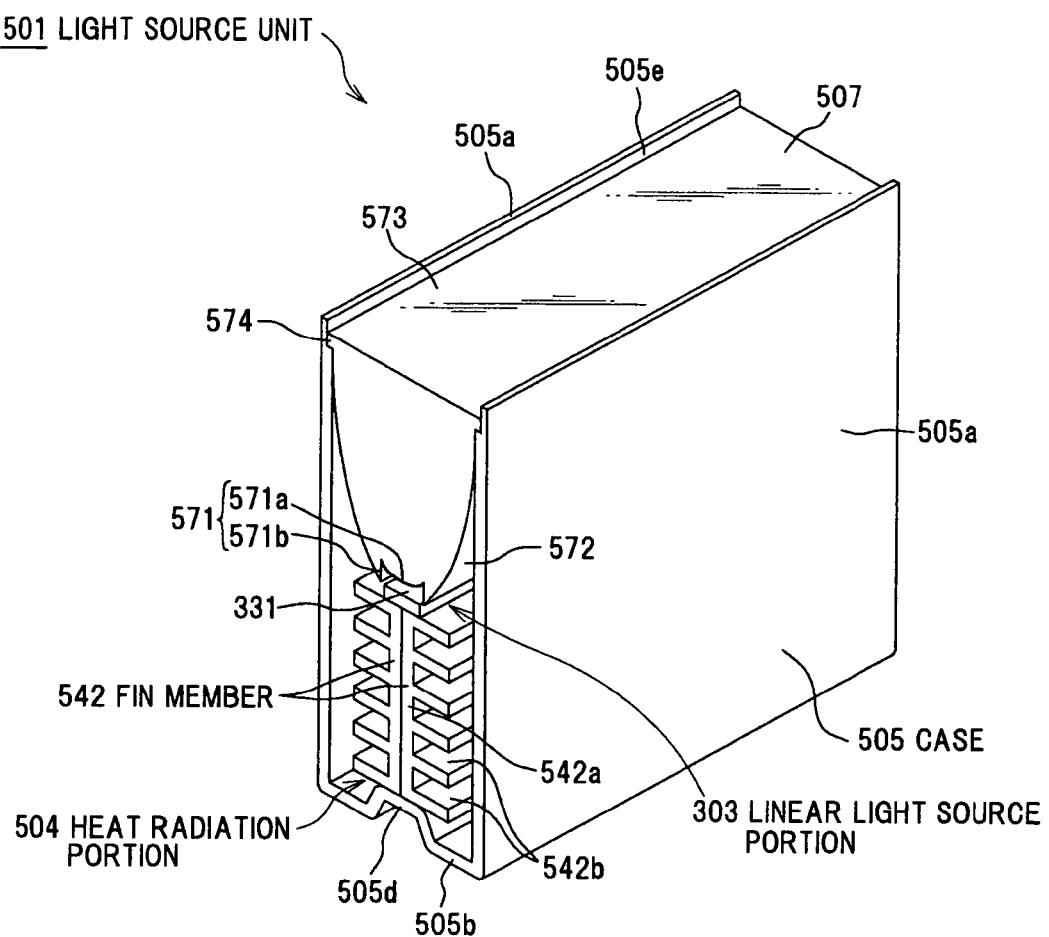
FIG. 11 is a perspective view showing a light source unit in a second preferred embodiment according to the invention.
Figure 12:
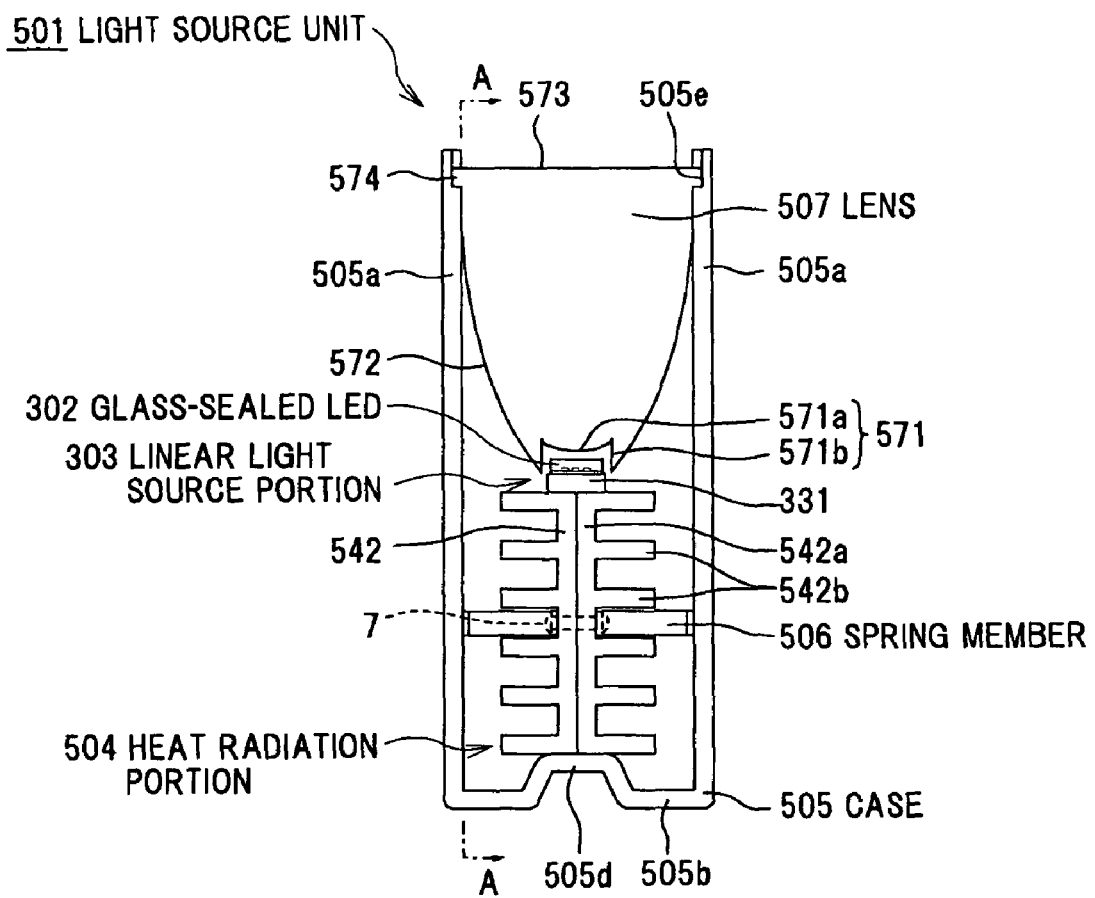
FIG. 12 is a front view showing the light source unit in FIG. 11.
Figure 13:
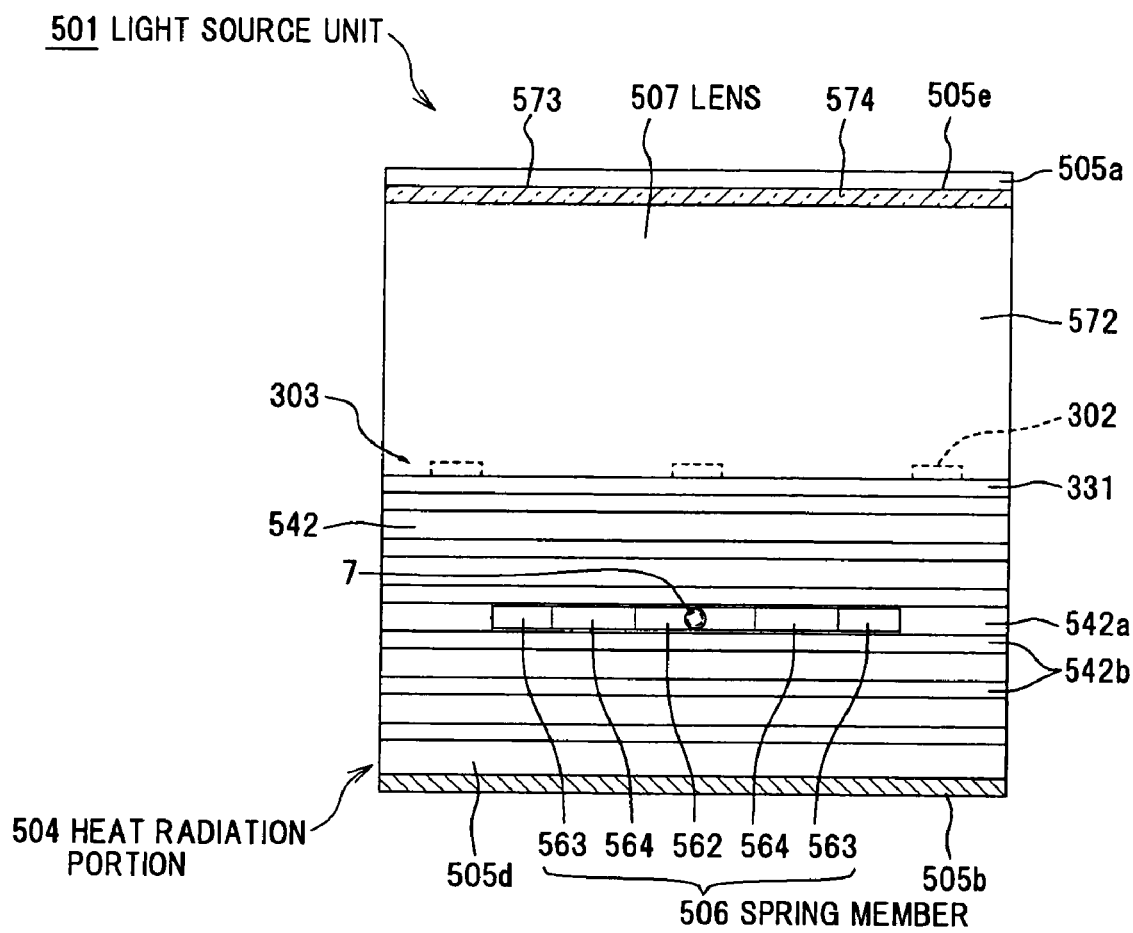
FIG. 13 is a cross sectional view cut along a line A-A in FIG. 12.

FIGS. 11 to 13 show the second preferred embodiment of the invention, and FIG. 11 is a perspective view showing a light source unit in the second embodiment.

As shown in FIG. 11, the light source unit 501 is composed of a linear light source portion 303 with the plural glass-sealed LEDs 302 (not shown in FIG. 11) mounted thereon, a heat radiation portion 504 connected to the bottom of the linear light source portion 303 and having a fin member 542 extending downward from the linear light source portion 303, and a case 505 housing the linear light source portion 303 and the heat radiation portion 504.

The case 505 is composed of a pair of sidewalls 505a having a thermal conductivity lower than the heat radiation portion 504 and disposed apart from the linear light source portion 303 and the heat radiation portion 504, a bottom wall 505b connecting the lower ends of the sidewalls 505a, and a convex portion 505d formed on the bottom wall 505b and projecting toward the heat radiation portion 504 to contact the heat radiation portion 504.

The light source unit 501 is further composed of a lens 507 fixed to the sidewalls 505a of the case 505 for optically controlling light radiated from the linear light source portion 303. The lens 507 is directly secured to the case 505 while being apart from the linear light source portion 303 and the heat radiation portion 504.

FIG. 12 is a front view showing the light source unit 501 in FIG. 11.

As shown in FIG. 12, the light source unit 501 is provided with a pair of spring members 506 between the sidewall 505a of the case 505 and the heat radiation portion 504 in the lateral direction. The heat radiation portion 504 is provided with a pair of the fin members 542 bonded via a soldering material (not shown) under the mounting board 331. The fin members 542 are formed of, e.g., aluminum and composed of a fixing portion 542a with a surface arranged perpendicular to the width (or lateral) direction and plural fins 542b extending outward in the lateral direction and arranged parallel to each other. The fin members 542 are fixed together with the spring members 506 by the rivet 7 such that the inside faces of the fixing portion 542a are contacted with each other. The lower end of the fin members 542 contacts the convex portion 505d of the bottom wall 505b.

The case 505 is opened upward such that light of the glass-sealed LED 302 can be outputted upward from the case 505. The bottom wall 505b is formed the convex portion 505d at the center in the lateral direction such that contact portion with the fin members 542 is higher than the connection (or bottom end) of the bottom wall 505b to the sidewalls 505a. The convex portion 505d is formed in the depth direction of the case 505 and forms a protrusion extending along the fixing portion 542a. Although the convex portion 505d is likely to receive heat because it contacts directly the heat radiation portion 504, it is difficult to touch directly from outside of the case 505 since it is located higher than the other part of the bottom wall 505b.

The lens 507 is formed of, e.g., acrylic resin and formed a cylindrical type extending along the longitudinal direction of the linear light source portion 303.

As shown in FIG. 12, the lens 507 is composed of an input portion 571 for inputting white light from the linear light source portion 303, a reflection surface 572 for reflecting light inputted into the lens 507 through the input portion 571, an output surface 573 for outputting light inside the lens 7 therethrough, and a flange 574 engaged with the sidewall 505a of the case 505.

The input portion 571 is concaved upward at the bottom of the lens 507 so as to cover the upper side of the linear light source portion 303. The input portion 571 is composed of a curved surface 571a formed convex downward directly on the linear light source portion 303, and a pair of flat surfaces 571b extending downward from both ends of the curved surface 571a in the width direction. The reflection surface 572 is formed on both sides of the lens 507 in the lateral direction and formed parabolic (in front view) defining a focal point at the LED elements of the glass-sealed LED 302. The flange 574 is formed projecting outward in the lateral direction at the upper end of the reflection surface 572, and fitted with a concave portion 505e formed at the upper end of the sidewalls 505a of the case 505. The output face 573 is formed flat at the top of the lens 507. In this embodiment, the upper side of the case 505 is closed by the lens 507 and a closed section is formed by the lens 507, the sidewalls 505a and the bottom wall 505b.

FIG. 13 is a cross sectional view cut along a line A-A in FIG. 12.

As shown in FIG. 13, the spring member 506 is formed of an iron alloy (with a thermal conductivity of 50 W·m$^{-1}$·K$^{-1}$), extends in the depth direction, and has a size in the vertical direction such that it is can be inserted between the adjacent fins 542b. In this embodiment, the pair of the spring members 506 arranged in the lateral direction are disposed at the center of the fin member 542 in the vertical direction. Here, the plural spring members 506 may be arranged parallel in the vertical direction. The spring members 506 are each composed of a fixing end 562 fixed to the fixing portion 542a of the fin member 542, a pair of contact ends 563 arranged in the depth direction and contacting the sidewall 505a of the case 505, and a pair of slope portions 564 extending outward in the lateral direction and obliquely in the depth direction from the front and back ends of contact portion 562, and connecting the lower end of the contact ends 563. The spring members 506 are formed by bending a sheet of a plate member and energized in such a direction that the fin member 542 and the sidewall 5a are apart from each other.

The light source unit 501 thus composed operates such that, of white light emitted from the glass-sealed LEDs 302 and inputted into the lens 507 through the input portion 571, light component inputted to the reflection surface 572 of the lens 507 is reflected upward by the reflection surface 572. Thus, white light can be outputted from the light source unit 501 with a predetermined width in the lateral (or width) direction.

Heat generated from the LED elements 22 of the glass-sealed LED 2 can be transferred through the board body to the fin members 542 of the heat radiation portion 504. Then, heat transferred to the fin members 542 can be discharged into the air through the surface of the fins 542b.

Thus, the light source unit 501 of this embodiment is devised such that the heat radiation property of the linear light source portion 303 can be significantly enhanced without exposing the heat radiation portion 504, so that heat generated from the plural glass-sealed LEDs 302 arranged in a row can be efficiently radiated. Therefore, even when the construction is changed to increase the amount of heat generation such that the light intensity of the LED elements 22 increases or the LED elements 22 are arranged densely, the performance of the LED elements 22 can be sufficiently brought out.

The lens 507 is apart from the linear light source portion 303 and the heat radiation portion 504, heat generated from the glass-sealed LED 2 cannot be conducted directly to the lens 507. The lens 507 is fixed to the case 505 with a relatively small thermal conductivity, so that heat generated from the glass-sealed LED 2 is little conducted to the lens 507. Therefore, the lens 507 can be prevented from deformation or deterioration caused by heat generation of the glass-sealed LED 2.

The sidewalls 505a of the case 505 are disposed apart from the linear light source portion 303 such that heat cannot be conducted directly from the linear light source portion 303. Furthermore, the spring members 506 are formed of the iron alloy with a thermal conductivity smaller than the fin members 542 such that heat transfer from the heat radiation portion 504 to the sidewalls 505a can be suppressed. Thus, temperature rise of the case 505 can be suppressed such that it is safe to hold the case 505 with hand.

The spring members 506 are disposed in close contact with the sidewall 505a of the case 505 while being fixed to the heat radiation portion 504, so that the heat radiation portion 504 can be positioned to the sidewalls 505a in the lateral direction. The spring members 506 are in elastic deformation such that they can absorb an error in dimension of parts and an error in installation of the parts, and the production yield of the unit can be improved thereby.

When the parts of the heat radiation portion 504 are thermally expanded by heat generated from the glass-sealed LED 302, stress generated inside the parts can be relaxed by the elastic deformation of the spring members 506. Especially when excessive load is applied to the spring members 506, since the spring members 506 are not restricted by the case 505, the contact ends 563 of the spring members 506 can slide on the sidewall 505a such that excessive stress is not generated in the heat radiation portion 504, the case 505 etc. as well as the spring members 506.

Thus, stress to the parts generated when feeding current to the glass-sealed LED 302 can be reduced to prevent the deformation of the parts. Also, the difference in repeated stress between turning on and turning off electricity can be reduced to enhance the reliability of the parts.

Third Embodiment

Figure 14:
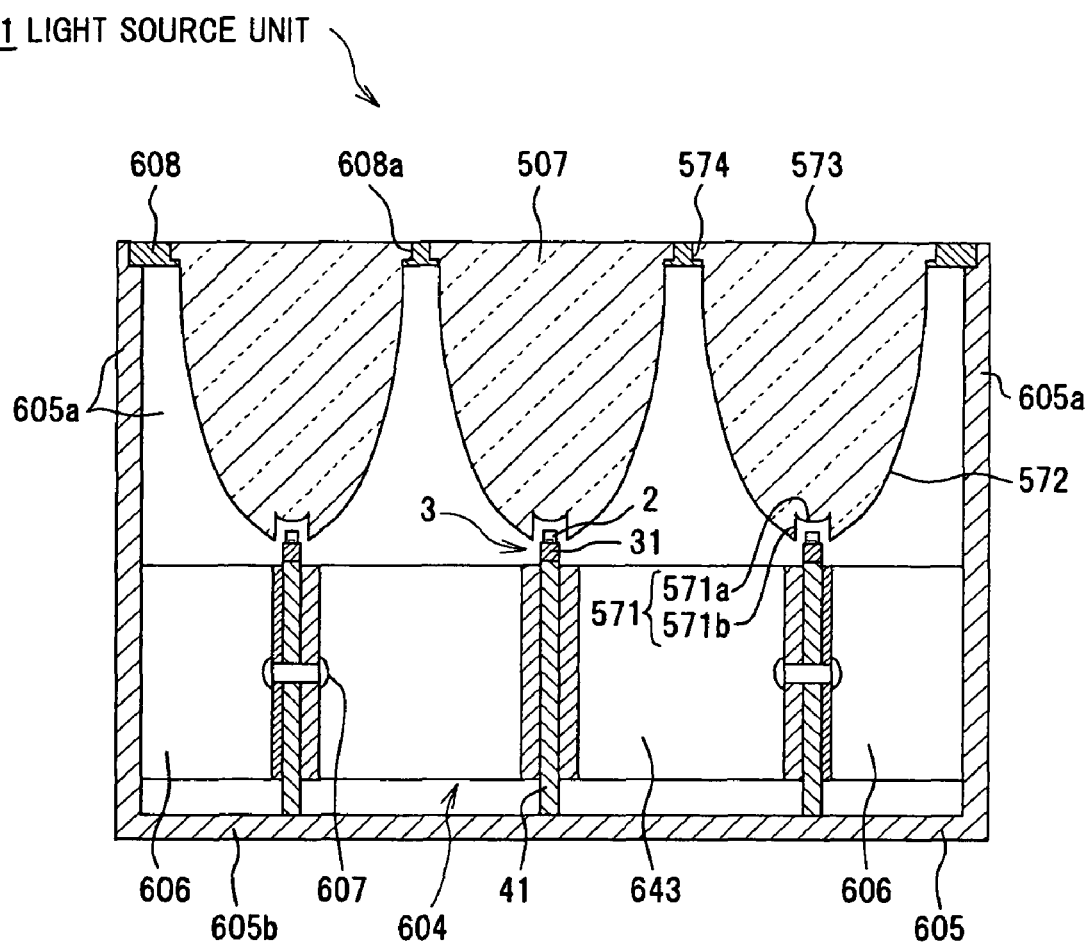
FIG. 14 is a cross sectional view showing a light source unit in a third preferred embodiment according to the invention.
Figure 15:
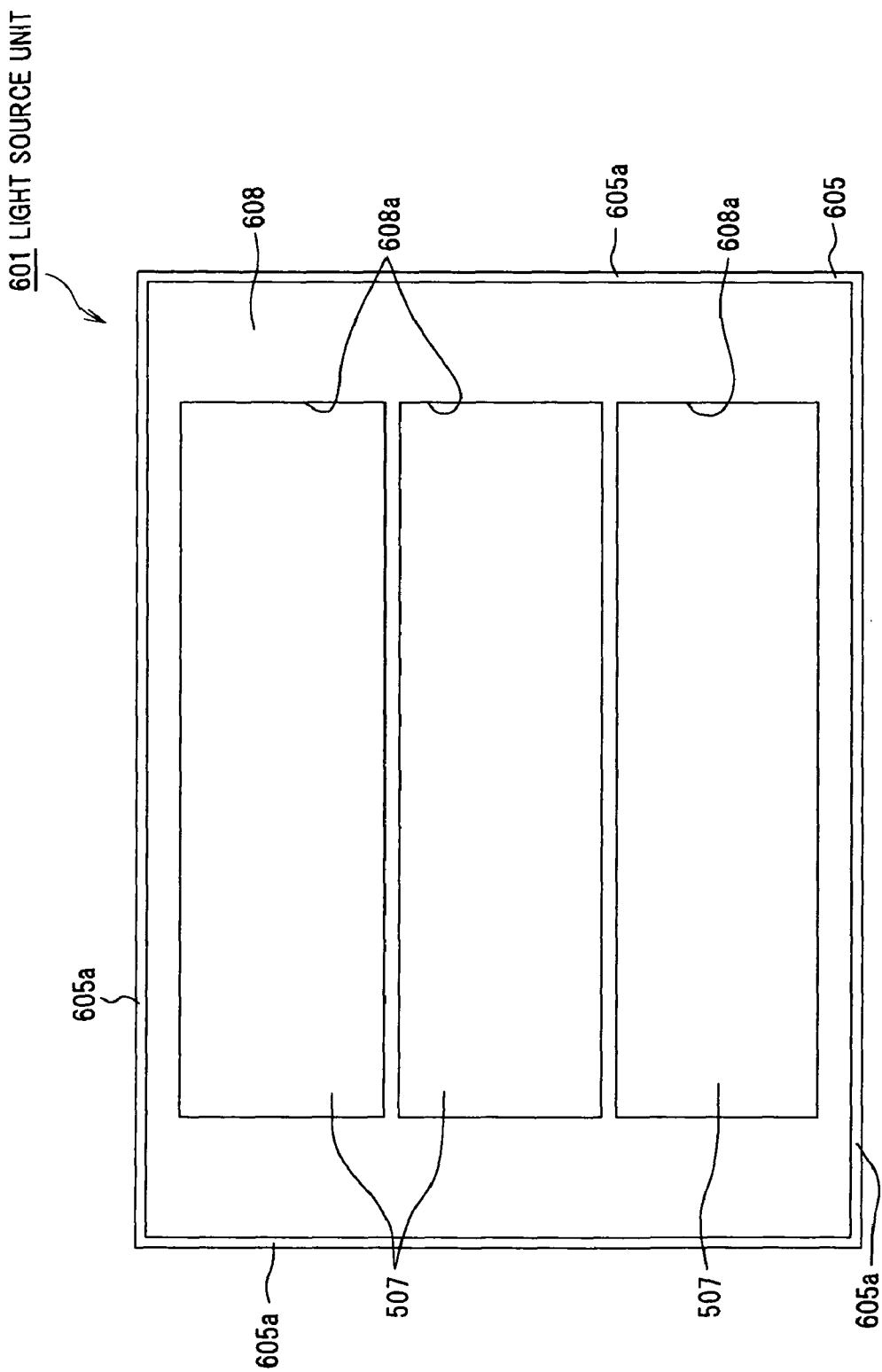
FIG. 15 is a top view showing the light source unit in FIG. 14.
Figure 16:
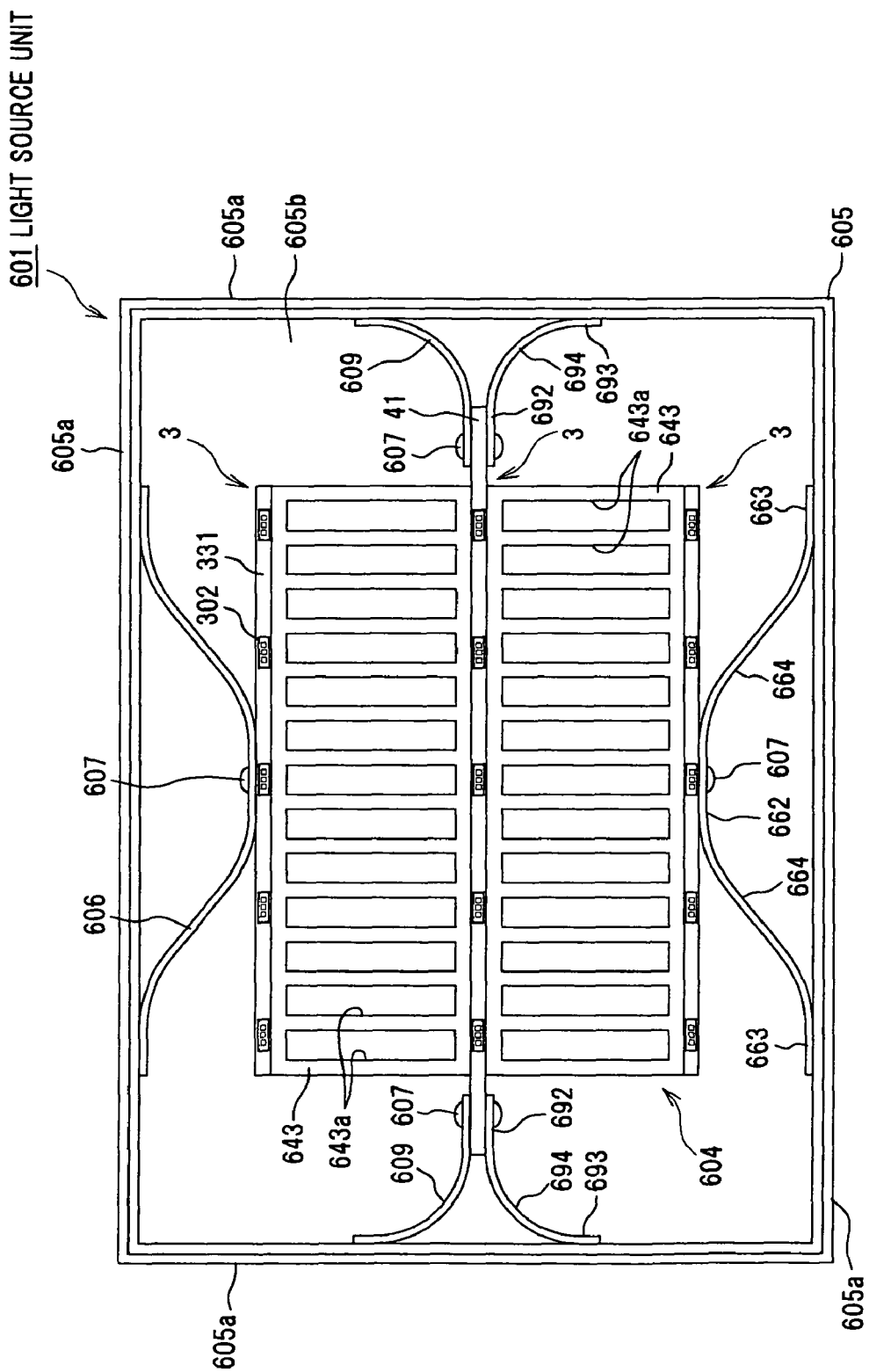
FIG. 16 is a top view showing the light source unit in FIG. 14 omitting a lens holding plate and lenses.

FIGS. 14 to 16 show the third preferred embodiment of the invention, and FIG. 14 is a cross sectional view showing a light source unit in the third embodiment.

As shown in FIG. 14, the light source unit 601 is composed of a linear light source portion 3 with the plural glass-sealed LEDs 2 mounted thereon, a heat radiation portion 604 connected to the bottom of the linear light source portion 3 and having a heat radiation plate 41 extending downward from the linear light source portion 3, and a case 605 housing the linear light source portion 3 and the heat radiation portion 4.

In this embodiment, the plural linear light source portions 3 and the heat radiation plates 41 are disposed parallel to each other, and the heat radiation portion 604 is provided with a heat radiation block 643 disposed between the heat radiation plates 41 in order to connect the two adjacent heat radiation plates 41.

The case 605 has a thermal conductivity lower than the heat radiation portion 604, and is composed of four sidewalls 605a disposed apart from the linear light source portion 3 and the heat radiation portion 604 and a bottom wall 605b connecting the lower end of the sidewalls 605a.

The light source unit 601 is further composed of plural lenses 507 fixed via a lens holding plate 608 to the sidewall 695a of the case 605 for optically controlling light radiated from the linear light source portion 603. The lens 507 is different from that of the second embodiment in dimensions in the input portion 571 and in the longitudinal direction.

FIG. 15 is a top view showing the light source unit in FIG. 14.

As shown in FIG. 15, the upper side of the case 605 is closed by the lens holding plate 608, and the lenses 507 are held by holding holes 608a formed in the lens holding plate 608.

FIG. 16 is a top view showing the light source unit omitting the lens holding plate and the lenses.

As shown in FIG. 16, the linear light source portions 3 of the light source unit 601 are composed such that the five glass-sealed LEDs 2 are mounted at equal intervals and they are each shorter than the linear light source portion 3 of the first embodiment in the longitudinal direction. In this embodiment, the three linear light source portions 3 and the three heat radiation plates 41 are provided, and the adjacent heat radiation plates 41 are connected by the rectangular (in top view) heat radiation block 643. Here, as shown, the heat radiation plates 41 connected to the linear light source portions 3 on both sides in the lateral direction have the same length as the linear light source portion 3, and the heat radiation plate 41 connected to the linear light source portion 3 at the center has a length more than the linear light source portion 3.

The heat radiation block 643 is formed of aluminum and provided with plural heat radiation holes 643a penetrating in the vertical direction (or in the depth direction in FIG. 16). In this embodiment, the heat radiation holes 643a each extend in the width direction of the linear light source portion 3 and are arranged parallel to each other in the longitudinal direction of the linear light source portion 3. The heat radiation block 643 has the same length of the linear light source portion 3, and common end faces in the longitudinal direction with the heat radiation plate 41 on both sides in the lateral direction.

As shown in FIG. 16, the light source unit 601 is provided with spring members 606, 609 between the sidewalls 605a of the case 605 and the heat radiation portion 604.

The two spring members 606 contacting the lateral sidewalls 605a of the case 605 are formed of iron and fixed by a bis (or screw) 607 to the center (in the longitudinal direction) of the heat radiation plates 41 on both sides in the lateral direction. The spring members 606 are each composed of a fixing end 662 fixed to the side face of the heat radiation plate 41, a pair of contact ends 663 contacting the sidewall 605a of the case 605, and a pair of slope portions 664 connecting the fixing end 662 and the contact ends 663. The spring members 606 are formed by bending a sheet of a plate member and energized in such a direction that the heat radiation portion 604 and the sidewall 605a are apart from each other.

The four spring members 609 contacting the front-back sidewalls 605a of the case 605 are formed of iron and fixed by the bis (or screw) 607 to the end portion (in the longitudinal direction) of the heat radiation plate 41 at the center in the lateral direction. In this embodiment, the two spring members 609 are disposed symmetrical in the lateral direction and attached to the end portion (in the longitudinal direction) of the heat radiation plate 41. The spring members 609 are each composed of a fixing end 692 fixed to the side face of the heat radiation plate 41, a contact end contacting the sidewall 605a of the case 605, and a curved portion 694 connecting the fixing end 692 and the contact end 693. The spring members 609 are formed by bending a sheet of a plate member and energized in such a direction that the heat radiation portion 604 and the sidewall 605a are apart from each other.

The light source unit 601 thus constructed is provided with the plural linear light source portions 3 and lenses 507 arranged parallel to each other. Thus, plural white lights with a predetermined width in the lateral direction and parallel to each other can be externally radiated from the light source unit 601.

Heat generated from the LED elements 22 of the glass-sealed LED 2 is transferred via the board body to the heat radiation plate 41 and the heat radiation block 643 of the heat radiation portion 604. Then, heat transferred to the heat radiation plate 41 and the heat radiation block 643 is radiated in the air through the surface of the heat radiation plate 41 and the heat radiation block 643. Here, the heat radiation holes 643a of the heat radiation block 643 are opened in the vertical direction such that the air can easy pass therethrough. Therefore, the air in the heat radiation hole 643a is heated by heat exchange with the heat radiation block 643, the heated air moves up and is discharged upward through the heat radiation hole 643a, and the air at relatively low temperature flows in the heat radiation hole 643a from below.

Thus, the light source unit 601 of this embodiment is devised such that the heat radiation property of the linear light source portion 3 can be significantly enhanced without exposing the heat radiation portion 604, so that heat generated from the plural glass-sealed LEDs 2 arranged in a row can be efficiently radiated. Therefore, even when the construction is changed to increase the amount of heat generation such that the light intensity of the LED elements 22 increases or the LED elements 22 are arranged densely, the performance of the LED elements 22 can be sufficiently brought out.

The spring members 606, 609 are disposed in close contact with the sidewall 605a of the case 605 while being fixed to the heat radiation portion 604, so that the heat radiation portion 604 can be positioned to the sidewalls 605a in the lateral direction and in the depth direction. The spring members 606, 609 are in elastic deformation such that they can absorb an error in dimension of parts and an error in installation of the parts, and the production yield of the unit can be improved thereby.

When the parts of the heat radiation portion 604 are thermally expanded by heat generated from the glass-sealed LED 2, stress generated inside the parts can be relaxed by the elastic deformation of the spring members 606, 609. Especially when excessive load is applied to the spring members 606, 609, since the spring members 606, 609 are not restricted by the case 605, the contact ends 663, 693 of the spring members 606, 609 can slide on the sidewall 605a such that excessive stress is not generated in the heat radiation portion 604, the case 605 etc. as well as the spring members 606, 609.

Thus, stress to the parts generated when feeding current to the glass-sealed LED 2 can be reduced to prevent the deformation of the parts. Also, the difference in repeated stress between turning on and turning off electricity can be reduced to enhance the reliability of the parts.

Fourth Embodiment

Figure 17:
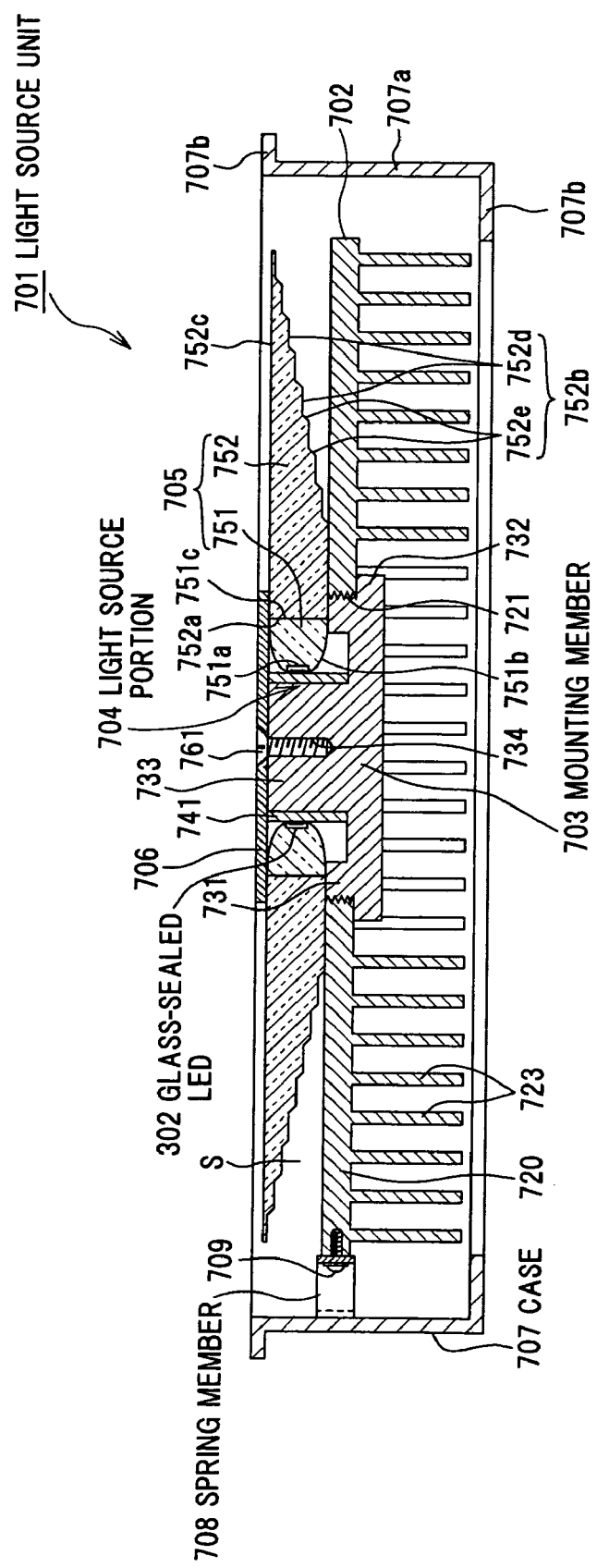
FIG. 17 is a cross sectional view showing a light source unit in a fourth preferred embodiment according to the invention.

FIGS. 17 and 18 show the fourth preferred embodiment of the invention, and FIG. 17 is a cross sectional view showing a light source unit in the fourth embodiment.

As shown in FIG. 17, the light source unit 701 is composed of a heat radiation portion 702 with a female screw hole 721 on an inner periphery thereof, a mounting member 703 with a male screw portion 731 for engaging with the female screw on an outer periphery thereof, a light source portion 704 mounted on a mounting portion 732 of the mounting member 703 and including the glass-sealed LEDs 302, an optical control portion 705 for optically controlling light radiated from the light source portion 704, a case 707 having a sidewall 707a formed apart from the light source portion 704 and the heat radiation portion 702, and spring members 708 between the sidewall 707*a* of the case 707 and the heat radiation portion 702.

The heat radiation portion 702 is formed of, e.g., aluminum and composed of a disk-shaped body 720, and the circular (in top view) screw hole 721 formed at the center of the body 720. The body 720 is provided with plural fins 723 formed downward at the entire bottom and parallel to each other.

The mounting member 703 is provided with a flange 732 extending radially outward from an axial end (lower end in FIG. 17) of the screw portion 731. The flange 732 is formed on the entire outer periphery of the screw portion 731 to contact the bottom of the body 720 of the heat radiation portion 702.

As shown in FIG. 17, the mounting member 703 is provided with the mounting portion 733 projecting upward from the top of the screw portion 731 and having a with smaller than the screw portion 731 in the width direction. The mounting portion 733 is formed equilateral hexagonal (in top view) and provided with six side faces 733*a* for mounting the light source portions 704 thereon. The top face of the mounting portion 733 is formed flat and a cover member 706 as described later is fixed thereon. The mounting portion 733 is provided with a female screw hole 734 in the top face for fixing the cover member 706.

The light source portion 704 is composed of a mounting substrate 741 bonded via a soldering material (not shown) to the mounting portion 733, and the glass-sealed LEDs 302 mounted on the mounting substrate 741. The mounting substrate 741 is composed of a substrate body of metal, an insulating layer of resin formed on the substrate body, a circuit pattern of metal formed on the insulating layer, and a resist layer of resin formed on the circuit pattern.

FIG. 18 is a top view showing the light source unit in FIG. 17.

As shown in FIG. 18, the optical control portion 705 is composed of an optical control member 751 for controlling light radiated from the glass-sealed LEDs 302 to travel in the radial direction (in the horizontal direction in FIG. 18), and a light-guiding plate 752 for controlling light outputted from the optical control member 751 to travel in the axial direction (upward in this embodiment) and outside the unit. The optical control member 751 is disposed outside the glass-sealed LEDs 302 in the radial direction, and the light-guiding plate 752 is disposed outside the optical control member 751 in the radial direction. The optical control member 751 and the light-guiding plate 752 are securely sandwiched between the screw portion 731 of the mounting member 703 and the cover member 706.

The optical control member 751 is formed of, e.g., acrylic resin and surrounds (in top view) the mounting portion 733 of the mounting member 703. The optical control member 751 is composed of an input portion 751*a* connected to the glass-sealed LEDs 302, a reflection surface 751*b* for reflecting light inputted inside the optical control member 751, and an output surface 751*c* for outputting light from the optical control member 751 therethrough. The input portion 751*a* is formed to enclose the glass-sealed LED 2 such that light radiated from the glass-sealed LED 2 is inputted therethrough. The reflection surface 751*b* is formed on both sides of the optical control member 751 in the vertical direction and formed parabolic (in side view) defining a focal point at the LED elements of the glass-sealed LED 302. The output surface 751*c* is formed parallel to a side face of the mounting portion 733 in cross section. In this embodiment, the optical control member 751 is circumferentially divided into six segments corresponding to the six glass-sealed LEDs 302. The six segments of the optical control member 751 are each formed trapezoidal (in top view) enlarging outward in the radial direction and a bottom thereof forms the output surface 751*c*. Namely, the output surfaces 751*c* of the optical control member 751 compose an equilateral hexagon (in top view).

The light-guiding plate 752 is formed of, e.g., acrylic resin and surrounds (in top view) the optical control member 751. The light-guiding plate 752 is composed of an input portion 752*a* connected to the optical control member 751, a reflection surface 752*b* for reflecting light inputted inside the light-guiding plate 752, and an output surface 752*c* for outputting light from the light-guiding plate 752 therethrough. The input surface 752*a* has the same size as the output surface 751*c* of the optical control member 751 such that light from the optical control member 751 is inputted therethrough. The reflection surface 752*b* is formed stepwise on one side of the light-guiding member 752, and the output surface 752*c* is formed flat opposite the reflection surface 752*b*. The light-guiding plate 752 is reduced in thickness outward in the radial direction.

The reflection surface 752*b* is provided with a parallel region 752*d* parallel to the output surface 752*c* and a slope region 752*e* inclined by a predetermined angle to the parallel region 752*d* that are alternately formed in the radial direction. The parallel region 752*d* and the slope region 752*e* are each formed annular (in top view). The slope region 752*e* is inclined by 45 degrees relative to the radial direction such that light inputted through the input surface 752*a* in the radial direction is reflected to travel in the axial direction and toward the output surface 752*c*. The slope regions 752*e* are equal in width in the radial direction and disposed at equal intervals in the radial direction. The inclined angle, width and interval of the slope regions 752*e* may be suitably changed according to the specifications of the light source unit 701. The parallel region 752*d* at the innermost in the radial direction contacts the body 720 of the heat radiation portion 702 and the reflection surface 752*b* is, except this parallel region 752*d*, apart from the body 720. In other words, a space S is formed between the reflection 752*d* and the body 720 of the heat radiation portion 702.

The cover member 706 is formed of, e.g., aluminum, disk-shaped, and fixed to the mounting member 703 by the screw 761. In this embodiment, light outputted from the light source portion 704 passes through the interval between the heat radiation portion 702 and the cover member 706 and is discharged outside the unit. The cover member 706 is provided with a screw hole at the center (in top view) for screwing the screw 761. The cover member 706 contacts the outer end of the optical control member 751 and the inner end of the light-guiding plate 752 in the radial direction.

The case 707 is composed of a cylindrical sidewall 707*a* and flanges 707*b* extending from both ends of the sidewall 707*a* in the radial direction. The case 707 is formed of a material with a thermal conductivity lower than the heat radiation portion 702 (formed of aluminum or stainless steel etc.).

The spring members 708 is formed of, e.g., iron, extends in the circumferential direction, and disposed between the body 720 of the heat radiation portion 702 and the sidewall 707*a* of the case 707. In this embodiment, the three spring members 708 are circumferentially arranged at equal intervals. The spring members 708 are each composed of a fixing end 782 fixed to the body 720 of the heat radiation portion 702 by a bis (or screw) 709, a pair of circumferential contact ends 783 contacting the sidewall 707*a* of the case 707, and a pair of slope portions 784 extending from both circumferential ends of the fixing end 782 and obliquely outward in the radial direction and connecting the contact ends 783. The spring members 708 are formed by bending a sheet of a plate member and energized in such a direction that the body 720 and the sidewall 707a are apart from each other.

The light source unit 701 thus composed operates such that, of white light emitted from the glass-sealed LEDs 302 and inputted into the optical control member 751 through the input portion 751a, light component inputted to the reflection surface 751b of the optical control member 751 is controlled to be reflected by the reflection surface 751a to travel toward the output surface 752c. Thereby, most of light emitted from the glass-sealed LEDs 302 can be directed to the output surface 751c.

Then, light inputted to the output surface 751c of the optical control member 751 is inputted to the inside of the light-guiding plate 752 parallel to the output surface 752c through the input surface 752a. Then, light parallel inputted to the inside of the light-guiding plate 752 is inputted to the slope regions 752d of the reflection surface 752b, reflected by the slope regions 752d, and inputted perpendicularly to the output surface 752c, and externally discharged through the output surface 752c. In this embodiment, the slope regions 752d are formed annular so that plural luminescence circles can be observed in top view.

The space S is provided between the reflection surface 752b of the light-guiding plate 752 and the body 720 of the heat radiation portion 702, and the space S is filled with the air (n=1.0) with a refractive index lower than the light-guiding plate 752. Therefore, the conditions of total reflection can be established at the reflection surface 752b such that most of light inputted to the light-guiding plate 752 can be extracted outside the unit through the output surface 752c. Meanwhile, light leaking into the space S through the reflection surface 752b can be inputted again to the light-guiding plate 752 after being reflected by the surface of the body 720 of heat radiation portion 702.

Heat generated from the glass-sealed LEDs 302 is transferred through the mounting substrate 741 to the mounting portion 733 of the mounting member 703. Then, heat transferred to the mounting portion 733 is transferred through the screw portion 731 and the flange 732 to the heat radiation portion 702, and externally radiated in the air through the surface of the heat radiation portion 702. In this embodiment, the heat radiation portion 702 is provided with the plural fins 723 such that it can have a large contact area with the air to enhance the heat radiation property. Also, heat transferred to the mounting substrate 733 is conducted to the cover member 706, and externally radiated in the air through the surface of the mounting substrate 733.

In this embodiment, the screw portion 731 is in diameter greater than the mounting portion 733 such that heat generated at the light source portion 704 can be securely transferred to the screw portion 731. Further, the screw portion 731 has a large contact area with the heat radiation portion 702 such that heat can be surely transferred through the engaging portion to the heat radiation portion 702. The screw portion 731 is provided with the flange 732 at one end in the axial direction and it is in plane contact with the heat radiation portion 702, so that heat can be also transferred through the flange 732 to the heat radiation portion 702.

Thus, the light source unit 701 of this embodiment is devised such that the heat radiation property of the light source portion 704 can be significantly enhanced to surely radiate heat generated from the plural glass-sealed LEDs 302. Therefore, even when the construction is changed to increase the amount of heat generation such that the light intensity of the LED elements increases or the LED elements are arranged densely, the performance of the LED elements can be sufficiently brought out.

The sidewall 707a of the case 707 is disposed apart from the light source portion 704 and the heat radiation portion 702 such that heat is not conducted directly from the light source portion 704. Thus, temperature rise of the case 707 can be suppressed such that it is safe to hold the case 707 with hand.

The spring members 708 are disposed in close contact with the sidewall 707a of the case 707 while being fixed to the heat radiation portion 702, so that the heat radiation portion 702 can be positioned to the sidewalls 707a in the lateral direction. The spring members 708 are in elastic deformation such that they can absorb an error in dimension of parts and an error in installation of the parts, and the production yield of the unit can be improved thereby.

When the parts of the heat radiation portion 702 are thermally expanded by heat generated from the glass-sealed LED 302, stress generated inside the parts can be relaxed by the elastic deformation of the spring members 708. Especially when excessive load is applied to the spring members 708, since the spring members 708 are not restricted by the case 707, the contact ends 783 of the spring members 708 can slide on the sidewall 707a such that excessive stress is not generated in the heat radiation portion 702, the case 707 etc. as well as the spring members 708.

Thus, stress to the parts generated when feeding current to the glass-sealed LED 302 can be reduced to prevent the deformation of the parts. Also, the difference in repeated stress between turning on and turning off electricity can be reduced to enhance the reliability of the parts.

In the first to third embodiments, the thickness, longitudinal and width directions of the mounting board 31, 331 are expressed as the vertical, depth and lateral directions, respectively. In the fourth embodiment, the direction of outputting light from the light-guiding plate 752 is expressed as the vertical direction. However, the light source units 1, 501, 601 and 701 can be used in arbitrary posture, e.g. a posture may be taken that light is outputted downward or horizontally.

In the above embodiments, the cases 5, 505, 605 and 707 are formed of stainless steel. Alternatively, they may be formed of another material such as resin.

In the first to third embodiments, the mounting board 31, 331 are composed of the board body of copper, i.e., copper base board. Alternatively, the mounting board may be another metal base board such as an aluminum base board. Also, the mounting board may be a flexible board of a base material such as polyimide or liquid-crystal polymer such that it is disposed between the glass-sealed LEDs and the heat radiation portion.

In the above embodiments, white light can be emitted from the glass-sealed LEDs 2, 302. Alternatively, the glass sealing portion 23 may not contain phosphor 23a dispersed therein such that the glass-sealed LED emits blue light.

The LED elements 22 are flip-chip mounted therein and, alternatively, may be face-up mounted.

The number of the LED elements 22 included in the glass-sealed LED 2, 302 can be selected arbitrarily as well as the disposition of the LED elements 22.

The LED element 22 may use a growth substrate of sapphire, where the growth substrate may be removed and/or replaced after growing nitride semiconductor layers thereon.

Thus, the details of the glass-sealed LED such as components, emission color etc. may be changed suitably. A resin-sealed LED may be used, though it is in reliability lower than the glass-sealed LED.

In the above embodiments, the spring members are plate-shaped. Alternatively, the spring members may be a coil spring, a disc spring etc. Although the spring members are fixed to the heat radiation portion and slide on the case, they may be alternatively fixed to the case and slide on the heat radiation portion. Also, the spring members may be fixed to both the heat radiation portion and the case or not fixed to both the heat radiation portion and the case.

Fifth Embodiment

FIGS. 19A to 20 show the fifth preferred embodiment of the invention. FIG. 19A is a top view showing a linear light source portion 803 in the fifth embodiment. FIG. 19B is a side view showing the linear light source portion 803 with a flexible substrate 831 and the heat radiation plate 41 attached thereto. FIG. 20 is an enlarged cross sectional view showing a region R in FIG. 19A.

As shown in FIG. 4, the first embodiment is constructed such that glass-sealed LED 2 is bonded via the mounting board 31 to the heat radiation plate 41. In contrast, the fifth embodiment is constructed such that the glass-sealed LED 2 is bonded to the heat radiation plate 41 without the mounting board 31. Instead of the mounting board 31, a flexible substrate 831 is disposed between the glass-sealed LED 2 and the heat radiation plate 41. As shown in FIG. 19A, the linear light source portion 803 is formed longer than the linear light source portion 3 in the longitudinal direction. As shown in FIG. 19B, the heat radiation plate 41 is provided with rounded corners 41b at ends thereof where it contacts the flexible substrate 831. As shown in FIGS. 19A to 20, like components are indicated by the same numerals as used in the first embodiment. The detailed explanations thereof are omitted below.

The flexible substrate 831 is disposed between the glass-sealed LED 2 and the heat radiation plate 41. The flexible substrate 831 is composed of an insulating layer 831a and a circuit pattern 831b sandwiched by the insulating layer 831a. The insulating layer 831a is formed of polyimide, liquid-crystal polymer, BT (bismaleimide triazine) resin, Teflon (TM) etc., where liquid-crystal polymer is preferable since it is lower than others in deterioration of reflectivity in high temperature-high humidity environment.

The flexible substrate 831 is not bonded to the heat radiation plate 41 although the circuit pattern 831b thereof is bonded via the solder material 37 to the electrode pattern 24b formed on the bottom surface of the ceramic substrate 21. Thus, the flexible substrate 831 is only put on the heat radiation plate 41 while the heat radiation pattern 26 of the glass-sealed LED 2 is bonded via the solder material 36 (about 100 μm thick) to the heat radiation plate 41 within an opening 831c of the flexible substrate 831. In other words, a fine airspace or gap is formed between the flexible substrate 831 and the heat radiation plate 41. By the airspace or gap thus formed, heat can be prevented from being conducted directly to the flexible substrate 831. Thus, the flexible substrate 831 can be prevented from deteriorating due to heat.

The linear light source portion 803 is extended to be longer than the linear light source portion 3 in the longitudinal direction. The first pattern exposed part 31a as an external connection terminal is located outside both ends of the heat radiation plate 41 in the longitudinal such that it is away from the metal member, i.e., the heat radiation plate 41. Thereby, short circuit can be prevented that may occur between an external wiring bonded to the first pattern exposed part 31a and the heat radiation plate 41. Also, the extended part of the linear light source portion 803 may be used directly as an external wiring instead of using a separate external wiring.

The heat radiation plate 41 is provided with the rounded corners 41b at ends thereof where it contacts the flexible substrate 831. The linear light source portion 803 with the flexible substrate 831 can be bent freely outside the heat radiation plate 41 in the longitudinal direction. Thus, the rounded corners 41b can prevent the damage of the flexible substrate 831 when the linear light source portion 803 is repeatedly bent at the corners.

Modification 5

Figure 21:
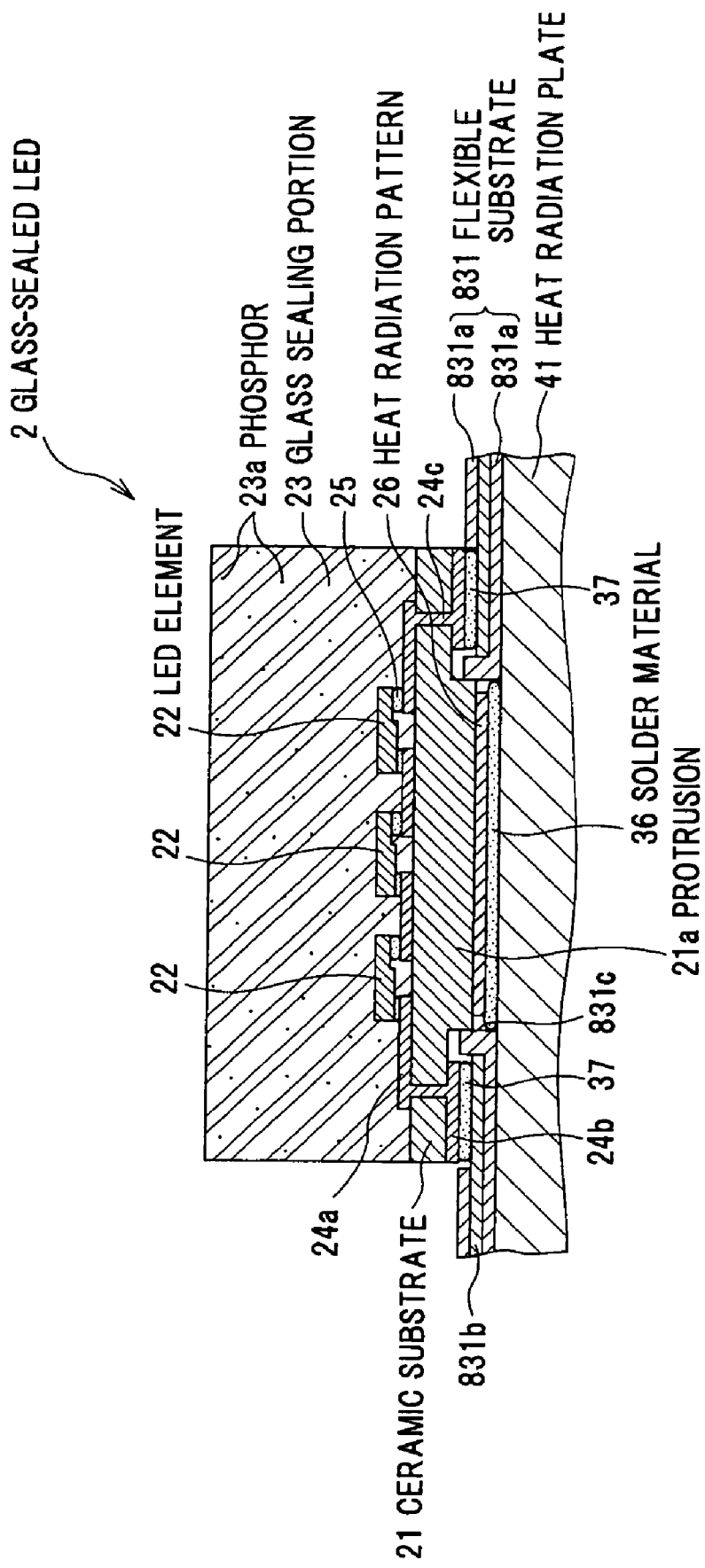
FIG. 21 is a cross sectional view showing a modification of the fifth embodiment.

As shown in FIG. 21, the ceramic substrate 21 of the fifth embodiment may be modified such that it is provided with a protrusion 21a (with a height of about 100 μm) protruding downward. Thereby, the amount of the soldering material 36 used can be reduced to about 10 μm thick. The reduced amount can improve evenness or uniformity in thickness of the soldering material 36 formed between the heat radiation pattern 26 and the heat radiation plate 41, and can prevent short circuit between the electrode pattern 24b and the heat radiation plate 41 that may occur when the excessive soldering material 36 penetrates through the electrode pattern 24b. Also, the protrusion 21a can facilitate the positioning of the glass-sealed LED 2 relative to the flexible substrate 831 with the opening 831c. The protrusion 21a of the ceramic substrate 21 can be easy formed by stacking ceramic green sheets and then sintering them.

Modification 6

Figure 22:
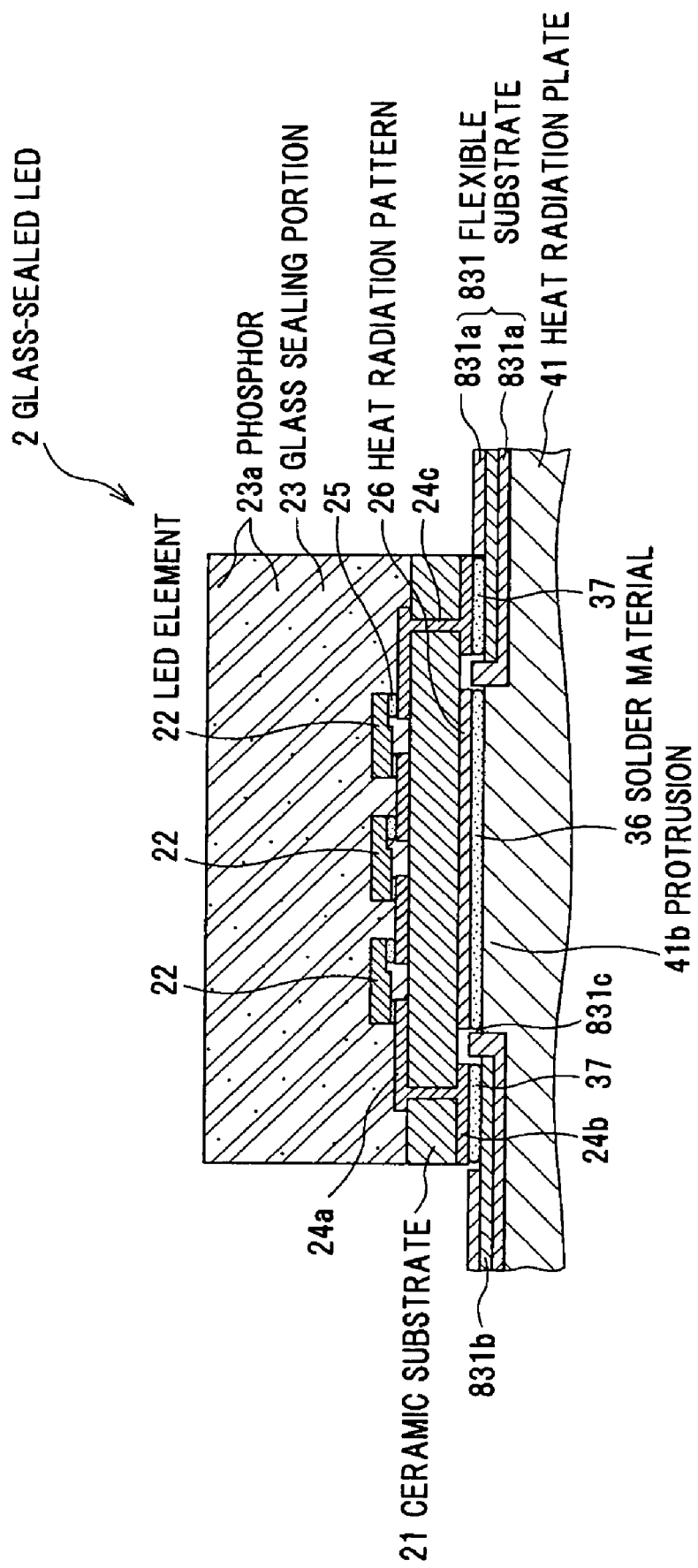
FIG. 22 is a cross sectional view showing another modification of the fifth embodiment.

Alternatively, as shown in FIG. 22, the heat radiation plate 41 of the fifth embodiment may be modified such that it is provided with a protrusion 41a (with a height of about 100 μm) protruding upward. Thereby, the amount of the soldering material 36 used can be reduced to about 10 μm thick. The reduced amount can improve evenness or uniformity in thickness of the soldering material 36 formed between the heat radiation pattern 26 and the heat radiation plate 41, and can prevent short circuit between the electrode pattern 24b and the heat radiation plate 41 that may occur when the excessive soldering material 36 penetrates through the electrode pattern 24b. Also, the protrusion 41a can facilitate the positioning of the glass-sealed LED 2 with the flexible substrate 831 (with the opening 831c) relative to the heat radiation plate 41. The protrusion 41a of the heat radiation plate 41 can be formed by etching etc.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light source unit, comprising:
    a light source portion comprising an LED element;
    a heat radiation portion that is connected to the light source portion;
    a case including an outside wall that is disposed apart from the light source portion and the heat radiation portion; and
    a spring member that is disposed between the outside wall of the case and the heat radiation portion,
    wherein the spring member is plate-shaped.

2. The light source unit according to claim 1, wherein:
    the light source portion further comprises a glass sealing portion that is formed of glass and seals the LED element.

3. The light source unit according to claim 2, wherein:
the light source portion further comprises a plurality of LED elements.

4. The light source unit according to claim 1, wherein:
the ease comprises a thermal conductivity lower than the heat radiation portion.

5. The light source unit according to claim 1, wherein:
the spring member slidably contacts at least one of the case and the heat radiation portion.

6. The light source unit according to claim 1, wherein:
the light source portion is elongated in a direction,
the heat radiation portion comprises a rectangular plate, and
one side of the rectangular plate is connected to the light source portion along the direction.

7. The light source unit according to claim 1, wherein:
the case comprises a thermal conductivity lower than the heat radiation portion, and
the spring member comprises a thermal conductivity between the case and the heat radiation portion.

8. The light source unit according to claim 1, further comprising:
a reflection plate that surrounds the LED element for reflecting light emitted from the LED element,
wherein the case comprises a thermal conductivity lower than the heat radiation portion, and
wherein the reflection plate comprises a thermal conductivity between the case and the heat radiation portion.

9. A light source unit, comprising:
a light source portion comprising an LED element;
a heat radiation portion that is connected to the light source portion;
a case including an outside wall that is disposed apart from the light source portion and the heat radiation portion; and
a spring member that is disposed between the outside wall of the case and the heat radiation portion,
wherein the light source portion is elongated in a direction,
wherein the heat radiation portion comprises a rectangular plate, and
wherein one side of the rectangular plate is connected to the light source portion along the direction.

10. A light source unit, comprising:
a light source portion comprising an LED element;
a heat radiation portion that is connected to the light source portion;
a case including an outside wall that is disposed apart from the light source portion and the heat radiation portion; and
a spring member that is disposed between the outside wall of the case and the heat radiation portion,
wherein the case comprises a thermal conductivity lower than the heat radiation portion, and
wherein the spring member comprises a thermal conductivity between the case and the heat radiation portion.

* * * * *